US012712518B2

(12) United States Patent
Mix et al.

(10) Patent No.: US 12,712,518 B2
(45) Date of Patent: Aug. 18, 2026

(54) ACOUSTIC WAVE CLOCK DISTRIBUTION

(71) Applicant: Intel Corporation, Santa Clara, CA (US)

(72) Inventors: Jason A. Mix, Portland, OR (US); Liwei Zhao, Tianjin (CN); Alexander T. Hoang, Camas, WA (US); Sarah Shahraini, Redmond, WA (US); Ruth Y. Vidana Morales, Zapopan (MX); Andrew Martwick, Portland, OR (US); Andrea S. Muljono, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 701 days.

(21) Appl. No.: 18/134,850

(22) Filed: Apr. 14, 2023

(65) Prior Publication Data

US 2023/0402990 A1 Dec. 14, 2023

Related U.S. Application Data

(63) Continuation of application No. PCT/CN2022/097951, filed on Jun. 9, 2022.

(51) Int. Cl.
*H03H 9/02* (2006.01)
*H03H 9/13* (2006.01)

(52) U.S. Cl.
CPC .... *H03H 9/02574* (2013.01); *H03H 9/02031* (2013.01); *H03H 9/02228* (2013.01); *H03H 9/132* (2013.01)

(58) Field of Classification Search
CPC ........... H03H 9/02574; H03H 9/02228; H03H 9/132; H10D 48/50; H10N 30/704;
(Continued)

(56) References Cited

U.S. PATENT DOCUMENTS 4,520,413 A * 5/1985 Piotrowski ............. G11B 5/332 257/225
6,953,977 B2 * 10/2005 Mlcak .................. H10N 30/076 257/421

(Continued)

FOREIGN PATENT DOCUMENTS

CN 113871248 A * 12/2021 ............. H10D 48/40
EP 3917009 A1 * 12/2021 ............. H10D 48/40

OTHER PUBLICATIONS

Aigner, R. et al.; Advancement of MEMS into RF-filter applications; (2002); Digest. International Electron Devices Meeting; pp. 897-900.

(Continued)

*Primary Examiner* — Pedro J Cuevas
(74) *Attorney, Agent, or Firm* — Alliance IP, LLC

(57) ABSTRACT

Clock distribution in an integrated circuit component can comprise the generation of bulk acoustic waves by acoustic transmitters and propagation of the bulk acoustic waves across the substrate where they are received by piezoelectric elements acting as acoustic receivers.

Clock distribution can also comprise the generation of surface acoustic waves by acoustic transmitters located on the same substrate surface as the piezoelectric elements.

An acoustic transmitter comprises a layer of piezoelectric material that generates an acoustic wave in response to the piezoelectric layer being activated by a clock source signal applied to the acoustic transmitter. The piezoelectric elements convert the acoustic waves into an electrical signal which can be used as a local clock signal for devices and components in the vicinity of the piezoelectric elements or from which such a local clock signal can be derived.

20 Claims, 14 Drawing Sheets

(58) Field of Classification Search
CPC .... H10N 30/20; H10N 30/30; H10N 30/8536; H10N 30/8542; H10N 30/8548; H10N 30/8554; H10N 30/8561; H10N 39/00
See application file for complete search history.

(56) References Cited

U.S. PATENT DOCUMENTS 7,851,243 B1 * 12/2010 Ueno .................. H01S 5/34333 438/46
7,858,963 B2 * 12/2010 Ueno .................. H01S 5/34333 257/14
8,058,641 B2 * 11/2011 Ahn ..................... H10H 20/822 257/17
8,067,257 B2 * 11/2011 Ueno .................. H01S 5/34333 257/14
8,357,558 B2 * 1/2013 Kyono ............... H10H 20/0137 438/47
8,524,517 B2 * 9/2013 Ahn ..................... H10H 20/822 257/85
8,710,551 B2 * 4/2014 Huang ............... H10D 30/4755 257/192
8,731,016 B2 * 5/2014 Kyono ................... B82Y 20/00 372/50.1
10,676,349 B1 * 6/2020 Grosjean ............. B81C 1/00698
10,680,066 B2 * 6/2020 Heo ................... H10N 70/8828
10,985,311 B2 * 4/2021 Koike .................. H10D 48/385
11,584,642 B1 * 2/2023 Grosjean ............. B81C 1/00698
11,600,549 B2 * 3/2023 Chen ....................... G06F 3/016
11,724,934 B2 * 8/2023 Grosjean ............. B81C 1/00698 331/154
11,975,965 B2 * 5/2024 Grosjean ............. B81C 1/00698
12,046,685 B2 * 7/2024 Van Der Wiel ........ H10D 48/50
12,194,495 B2 * 1/2025 Guo ...................... B06B 1/0223
12,310,242 B2 * 5/2025 Hamada ................. B41J 2/1642
12,382,832 B2 * 8/2025 Carroll ................... H10N 10/01
12,492,120 B2 * 12/2025 Grosjean ............. B81C 1/00698
2003/0119220 A1 * 6/2003 Mlcak .................. H10N 30/081 438/52
2010/0213439 A1 * 8/2010 Ueno .................. H01S 5/34333 257/14
2010/0297784 A1 * 11/2010 Ueno .................. H01S 5/34333 438/10
2011/0042644 A2 * 2/2011 Ueno .................. H01S 5/34333 257/14
2011/0057167 A1 * 3/2011 Ueno .................. H01S 5/34333 257/E33.048
2011/0076788 A1 * 3/2011 Kyono ............... H10H 20/0137 257/E21.53
2011/0114995 A1 * 5/2011 Ahn ..................... H10H 20/822 257/E33.037
2011/0227035 A1 * 9/2011 Kyono ................. H10H 20/811 257/E33.007
2012/0040483 A1 * 2/2012 Ahn ..................... H10H 20/822 438/46
2012/0080659 A1 * 4/2012 Ueno .................. H01S 5/34333 257/13
2013/0142210 A1 * 6/2013 Kyono .................. H01S 5/3215 372/45.011
2014/0061724 A1 * 3/2014 Huang ................. H10D 30/015 257/E21.403
2014/0187003 A1 * 7/2014 Huang ................. H10D 30/015 438/172
2019/0103539 A1 * 4/2019 Carroll ................... H10N 30/30
2020/0098979 A1 * 3/2020 Koike .................... H10N 50/80
2021/0260620 A1 * 8/2021 Guo ...................... B06B 1/0692
2021/0376166 A1 * 12/2021 Van Der Wiel .... H03K 17/9505
2022/0165642 A1 * 5/2022 Chen ....................... G06F 3/016
2023/0183060 A1 * 6/2023 Grosjean ............. B81C 1/00698 331/154
2023/0210011 A1 * 6/2023 Hamada ............... H10N 30/708 347/71
2023/0416081 A1 * 12/2023 Grosjean ............. B81C 1/00698
2023/0420553 A1 * 12/2023 Lin ...................... H10D 30/475
2025/0026631 A1 * 1/2025 Matsubara ........... H10N 30/045
2025/0112618 A1 * 4/2025 Nodake .................. H03H 9/145
2025/0128937 A1 * 4/2025 Grosjean ............. B81C 1/00698

OTHER PUBLICATIONS

Hoople, J. et al.; Chipscale GHz ultrasonic channels for fingerprint scanning; (2015); IEEE International Ultrasonics Symposium (IUS); pp. 1-4.

Lam, C.S.; A review of the recent development of MEMS and crystal oscillators and their impacts on the frequency control products industry; (2008); IEEE Ultrasonics Symposium; pp. 694-704.

* cited by examiner

ACOUSTIC WAVE CLOCK DISTRIBUTION

This application is a continuation of International Application No. PCT/CN2022/097951, filed Jun. 9, 2022, entitled "ACOUSTIC WAVE CLOCK DISTRIBUTION," the entirety of which application is incorporated herein by reference in its entirety.

BACKGROUND

Clock trees can be used to distribute a clock source signal to devices and components within an integrated circuit component. Clock trees comprise clock buffers and electrically conductive traces used for clock signal routing. Integrated circuit components can comprise additional circuit components related to clock signal generation and distribution, such as voltage-controlled oscillators (VCOs), phase-locked loops (PLLs), clock dividers, and clock multipliers.

A piezoelectric is a crystal material that lacks lattice symmetry. When mechanical pressure is applied to the piezoelectric, the ions of the material compress and generate a net polarization. This polarization generates an electric field and thus, an electrical voltage. The reverse transformation of electrical to mechanical energy is also possible. This phenomenon is called the piezoelectric effect.

DETAILED DESCRIPTION

Figure 1B:
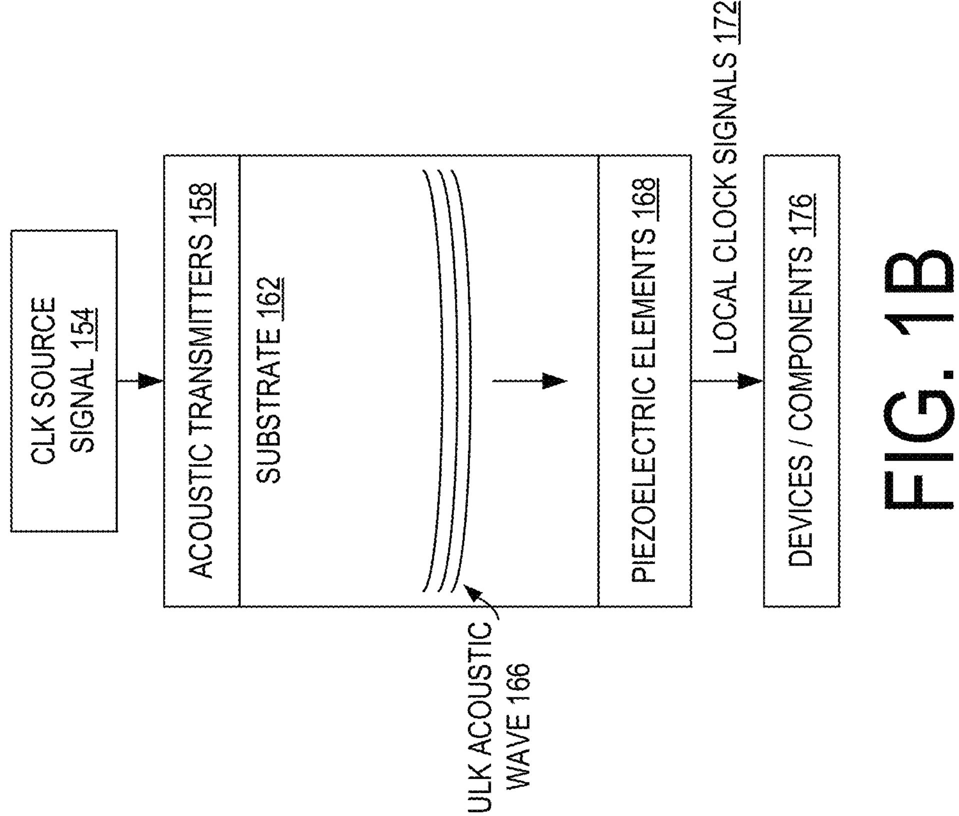
FIG. 1B illustrates an example acoustic distribution of a clock signal.

In some system-on-a-chip (SoC) designs, clock tree power consumption can comprise up to 30% of the total SoC power consumption. The routing of clock signals can utilize multiple layers in a metallization stack and unequal routing paths can result in uncertainties in the timing paths of circuit operations of an integrated circuit component. This can cause timing delays which in turn can result in a reduction in integrated circuit computing time and efficiency. One approach to reducing clock timing uncertainty is to tune the clock delays from a clock root node to clock leaf nodes so that they are made as equal as possible across the leaf nodes. The delays in a clock tree can be tuned during the design process or during operation by configuring clock delay tuning circuitry. However, tuning clock delays during the design cycle can lengthen the design time of an integrated circuit component and the addition of clock delay tuning circuitry can increase the power consumption and size of an integrated circuit die.

Disclosed herein are technologies for utilizing acoustic waves instead of a clock tree to distribute a clock source signal throughout an integrated circuit component. That is, a clock signal is distributed in the acoustic domain instead of the electrical domain. In some embodiments, acoustic transmitters located on a first surface (e.g., a back side) of a substrate and comprising piezoelectric transducers convert an electrical clock signal into bulk acoustic waves that propagate through the substrate to a second surface (e.g., a front side) of the substrate. Piezoelectric elements at the second surface of the substrate convert the bulk acoustic waves back into an electrical signal. In other embodiments, acoustic transmitters located on a substrate surface convert an electrical clock signal into surface acoustic waves that propagate along the substrate surface on which the acoustic transmitters are located and the piezoelectric elements convert the surface acoustic waves back into an electrical signal. Thus, acoustic transmitters are acoustically coupled to the piezoelectric elements. In some embodiments, an electrical signal generated by a piezoelectric element from an acoustic wave can be provided to devices and components (e.g., logic blocks, logic gates, transistors) located in the vicinity of the piezoelectric element as a local clock signal or converted into such a local clock signal. In some embodiments, the piezoelectric element can be a piezoelectric transistor.

As will be described below, a piezoelectric transistor can have a structure similar to that of a metal-oxide-semiconductor field-effect transistor (MOSFET) in which the gate and gate oxide layers (or just the gate layer) are replaced by a piezoelectric layer that can convert bulk or surface acoustic waves into an electrical signal. In some embodiments, the piezoelectric transistor can be part of a clocked logic and circuit element, such as sequential logic circuitry.

The acoustic wave clock distribution technologies described herein have at least the following advantages. Distributing a clock signal via acoustic waves can result in die area reduction and significant power savings through the elimination of clock tree components (clock buffers, clock signal routing, voltage-controlled oscillators (VCOs), phase-locked loops (PLLs), clock dividers, clock multipliers, etc.). Clock timing uncertainty can be reduced by bulk acoustic waves generated at a back side of a substrate reaching the front side of the substrate at substantially the same time over the front side of the substrate. Clock signal latency can be reduced by replacing the transmission of clock signals from a clock source along lengthy clock tree paths with the transmission of bulk or surface acoustic waves. The reduction of timing uncertainty can result in integrated circuit components with greater computing time and efficiency relative to those possessing clock trees. That is, the acoustic clock distribution technologies described herein can enable faster integrated circuit component operation at lower power consumption levels. Design complexity can be reduced by obviating the need for integrated circuit component designers to carefully craft balanced clock trees in an attempt to equalize delays from the root of the clock tree to its numerous leaves. The elimination of clock tree routing can enable smaller integrated circuit designs and reduce the complexity of their layout.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact. Furthermore, the terms "comprising," "including," "having," and the like, as used with respect to embodiments of the present disclosure, are synonymous.

Terms modified by the word "substantially" include arrangements, orientations, spacings, or positions that vary slightly from the meaning of the unmodified term. For example, the portion of a first layer or feature that is substantially perpendicular to a second layer or feature can include a first layer or feature that is +/−20 degrees from a second layer or feature, a first surface that is substantially parallel to a second surface can include a first surface that is within several degrees of parallel from the second surface, and acoustic impedances, frequencies, times, and clock phases that substantially match other acoustic impedances, frequencies, times, and clock phases are within 10% of each other. Values modified by the word "about" include values with +/−10% of the described values and values listed as being within a range include those within a range from 10% less than the described lower range limit and 10% greater than the described higher range limit.

As used herein, the phrases "conductively coupled" and "conductive coupling" refer to components that are coupled to facilitate the flow of electrical current between them. For example, conductively coupled components can be connected by one or more conductive traces (such as conductive traces belonging to one or more layers of a metallization stack), vias, and/or contacts.

As used herein, the phrase "located on" in the context of a first layer or component located on a second layer or component refers to the first layer or component being directly physically attached to the second layer or component (with no layers or components between the first and second layers or components) or physically attached to the second layer or component with one or more intervening layers or components. For example, with reference to FIG. 3, the piezoelectric layer 318 is located on the substrate 304 (with an intervening metal layer 326).

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the term "integrated circuit component" refers to a packaged or unpacked integrated circuit product. A packaged integrated circuit component comprises one or more integrated circuit dies mounted on a package substrate with the integrated circuit dies and package substrate encapsulated in a casing material, such as a metal, plastic, glass, or ceramic. In one example, a packaged integrated circuit component contains one or more processor units mounted on a substrate with an exterior surface of the substrate comprising a solder ball grid array (BGA). In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component described or referenced herein or any other computing system component, such as a processor unit (e.g., system-on-a-chip (SoC), processor core, graphics processor unit (GPU), accelerator, chipset processor), I/O controller, memory, or network interface controller.

As used herein, the terms "operating", "executing", or "running" as they pertain to software or firmware in relation to a system, device, platform, or resource are used interchangeably and can refer to software or firmware stored in one or more computer-readable storage media accessible by the system, device, platform or resource, even though the software or firmware instructions are not actively being executed by the system, device, platform, or resource.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims FIG. 1A illustrates an example clock tree. The clock tree 100 comprises multiple levels 104 of electronic circuitry (e.g., clock buffers, clock-gated circuitry (such as clock-gated logic gates)) and electrically conductive traces to distribute a clock source signal 108 to devices and components 112 of an integrated circuit component.

Figure 1A:
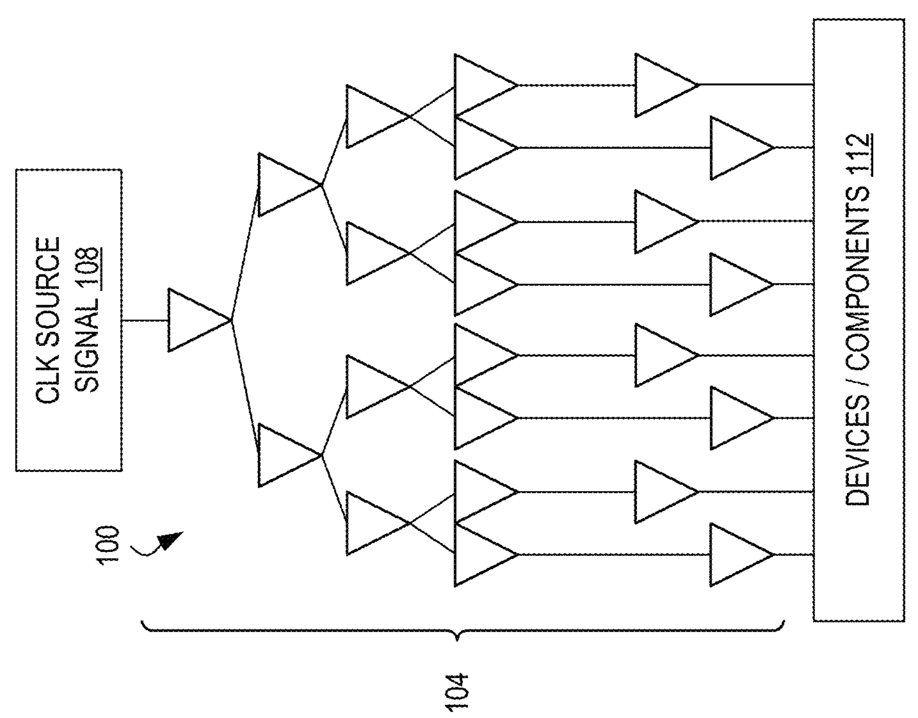
FIG. 1A illustrates an example clock tree.

FIG. 1B illustrates an example acoustic distribution of a clock signal. A clock source signal 154 is provided to acoustic transmitters 158 (piezoelectric transducers, resonators) located on a first surface of a substrate 162 that generate bulk acoustic waves 166 that propagate through the substrate 162 to piezoelectric elements 168 located at an opposite surface of the substrate 162. The piezoelectric elements 168 convert the bulk acoustic waves 166 into local clock signals 172 provided to devices and components 176 of an integrated circuit component or electrical signals from which local clock signals 172 can be derived. Clock source signals (e.g., 108, 154) can be external signals provided to an integrated circuit component or generated within an integrated circuit component. In another example distribution of a clock signal, a clock source signal is provided to acoustic transmitters that generate surface waves that propagate along a surface of the substrate to piezoelectric elements located on the same substrate surface as the acoustic transmitters.

Figure 2:
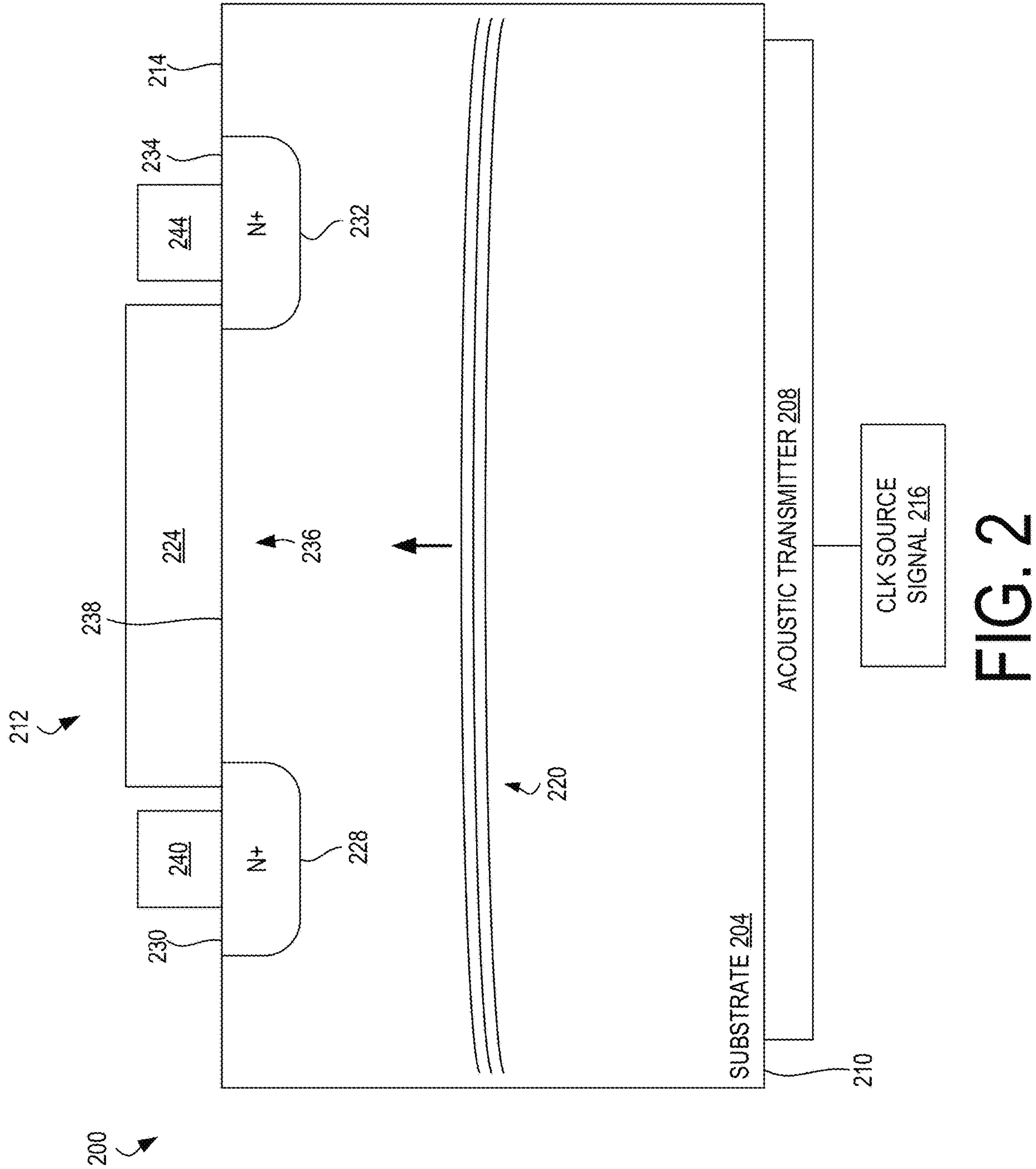
FIG. 2 illustrates a first example structure for bulk acoustic wave clock distribution.

FIG. 2 illustrates a first example structure for bulk acoustic wave clock distribution. The structure 200 comprises a substrate 204, an acoustic transmitter 208 located on a first surface 210 of the substrate 204, and a piezoelectric transistor 212 located on a second surface 214 of the substrate 204. The first surface 210 is opposite and substantially parallel to the second surface 214. The acoustic transmitter 208 is a transducer that vibrates in response to the application of an electrical clock source signal 216 to the acoustic transmitter 208. The resulting bulk acoustic waves 220 that are generated propagate through the substrate 204 to the piezoelectric transistor 212, which acts as an acoustic receiver. The substrate 204 can comprise a semiconductor comprising silicon (e.g., bulk silicon, silicon-on-insulator (e.g., bulk silicon with a buried silicon dioxide layer)), silicon and carbon (e.g., silicon carbide), gallium and arsenic (e.g., gallium arsenide), germanium (e.g., bulk germanium), silicon and germanium (e.g., silicon germanium) or diamond (e.g., bulk diamond). In other embodiments, the substrate 204 can be a substrate comprising one or more other materials upon which an integrated circuit can be fabricated or to which integrated circuits fabricated on another substrate can be attached.

The acoustic transmitter 208 comprises a layer of piezoelectric material (piezoelectric layer) that vibrates in response to the application of an electric field (e.g., the application of a source clock signal) across the piezoelectric layer. The piezoelectric layer can comprise any suitable piezoelectric material, such as aluminum nitride (AlN, comprising aluminum and nitrogen), ScAlN (scandium-doped aluminum nitride, comprising scandium, aluminum, and nitrogen), barium titanate ($BaTiO_3$, comprising barium, titanium, and oxygen), lithium-doped barium titanate (Li-doped $BaTiO_3$, comprising lithium, barium, titanium, and oxygen), polyvinylidene fluoride ($—(C_2H_2F_2)_n—$ or PVDF, comprising carbon, hydrogen, and fluorine), hafnium oxide ($HfO_2$, comprising hafnium and oxygen), lead titanate ($PbTiO_3$, comprising lead, titanium, and oxygen), lithium niobate ($LiNbO_3$, comprising lithium, niobium, and oxygen), lithium tantalate (LiTaO3, comprising lithium, tantalum, and oxygen), lead zirconium titanate (PZT (e.g., PZT-5H, PZT-5A), comprising lead, zirconium, titanium, and oxygen), lead magnesium niobate-lead titanate ($(1-x)Pb(Mg_{1/3}Nb_{2/3})O_3$-$xPbTiO_3$ or PMN-PT, comprising lead, magnesium, niobium, oxygen, and titanium), or beryllium oxide (BeO, comprising beryllium and oxygen).

In some embodiments, the acoustic transmitter 208 can comprise a piezoelectric layer positioned between two metal layers that act as terminals or electrodes for a differential signal (e.g., a clock signal) to be applied across the piezoelectric layer. In other embodiments, the two metal layers can be located on the same surface of the piezoelectric layer. As will be discussed further below in regards to FIG. 3, the acoustic transmitter 208 can comprise a termination layer located on an opposite surface of the piezoelectric layer to the substrate. As the resonant frequency of a piezoelectric layer is inversely proportional to the thickness of the piezoelectric layer, the thicknesses of the piezoelectric layer of the acoustic transmitter 208 and the piezoelectric layer in an acoustic receiver (e.g., piezoelectric transistor 212) can be chosen based on the frequency of the clock signal to be distributed acoustically; the higher the frequency of the clock signal to be distributed acoustically utilizing the technologies described herein, the thinner the piezoelectric layer of the acoustic transmitter generating the acoustic waves and the piezoelectric element receiving the acoustic waves. In one embodiment, an acoustic transmitter comprising a ScAlN piezoelectric layer having a thickness of 1.0 um and positioned between two molybdenum layers each having a thickness of 100 nm has a resonance frequency of about 1.8 GHz. In some embodiments, the frequency of the acoustic wave generated by the acoustic transmitter can be based on the physical design of the acoustic transmitter (e.g., by a lithographically-defined acoustic transmitter shape). In some embodiments, the frequency of the acoustic wave generated by the acoustic transmitter can be based on properties of the metal layers located on the acoustic transmitter or between which the acoustic transmitter is positioned.

The piezoelectric transistor 212 is similar in structure to a MOSFET in that the piezoelectric transistor 212 comprises a gate 224, source 228, drain 232, and channel 236 regions. The drain region 232 comprises a first portion 234 of the surface 214, the source region 228 comprises a second portion 230 of the surface 214, and the channel region comprises a third portion 238 of the surface 214. The channel region 236 extends from the source region 228 to the drain region 232, with a voltage on the gate 224 controlling the flow of charge carriers across the channel region 236. The gate 224 can overlap at least a portion of the drain and source regions 232 and 228.

FIG. 2 illustrates an n-type piezoelectric transistor 212 in which n-type source 228 and drain 232 regions comprise one or more n-type dopants. If there are any p-type dopants in the source and drain regions 228 and 232, at least one of the n-type dopants in the source and drain regions 228 and 232 has concentration levels greater than those of the p-type dopants in the source and drain regions 228 and 232. The channel region 236 in the n-type piezoelectric transistor 212 comprises one or more p-type dopants. If there are any n-type dopants in the channel region 236, at least one of the p-type dopants in the channel region 236 has concentration levels greater than those of the n-type dopants in the channel region 236. Conversely, a p-type piezoelectric transistor comprises source and drain regions 228 and 232 comprising one or more p-type dopants. If there are any n-type dopants in the source and drain regions 228 and 232, at least one of the p-type dopants in the source and drain regions 228 and 232 has concentration levels greater than those of the n-type dopants in the source and drain regions 228 and 232. The channel region 236 in a p-type piezoelectric transistor comprises one or more n-type dopants. If there are any p-type dopants in the channel region 236, at least one of the n-type dopants in the channel region 236 has concentration levels greater than those of the p-type dopants in the channel region 236.

In embodiments where the substrate comprises a group IV semiconductor (e.g., silicon, silicon carbide, germanium, silicon germanium), common n-type dopants include group V elements such as arsenic and phosphorous, and common p-type dopants include group III elements such as boron and gallium. For a substrate comprising a particular semiconductor material, any donor element can be used as an n-type dopant and any acceptor element can be used as a p-type dopant. A source contact 240 contacts the source region 228 and a drain contact 244 contacts the drain region 232. Differences between the piezoelectric transistor 212 and a MOSFET include the gate 224 of the piezoelectric transistor 212 comprising a piezoelectric material and the piezoelectric transistor 212 not having a gate oxide between the gate 224 and the channel region 236.

The gate 224 of the piezoelectric transistor 212 can comprise multiple piezoelectric layers, the individual layers comprising any of the piezoelectric material described or referenced herein that could be used for the acoustic transmitter, or any other suitable piezoelectric material. For example, the gate 224 can comprise a layer of hafnium oxide positioned adjacent to the surface of a substrate and a layer of a piezoelectric ceramic (e.g., PZT) positioned adjacent to the hafnium oxide layer.

The piezoelectric transistor 212 can generate an electrical signal in response to being activated by a bulk acoustic wave as follows. The bulk acoustic wave generated by an acoustic transmitter propagates across the substrate to reach the gate of a piezoelectric transistor. The piezoelectric nature of the piezoelectric transistor gate transforms the bulk acoustic wave into an electric field across the gate that oscillates at the frequency of the bulk acoustic wave (the clock frequency, if the acoustic transmitter was activated using a clock source signal). This oscillating electric field can cause the piezoelectric transistor 212 to oscillate between an "on" state (having a lower channel resistance relative to an "off" state of the transistor) and an "off" state (having a higher channel resistance relative to an "on" state of the transistor) at the frequency of the bulk acoustic wave. An electrical clock signal in the form of oscillating current and/or voltage can be produced at either the drain region 232 or the source region 228 of the piezoelectric transistor 212. In some embodiments, this electrical output signal of the piezoelectric transistor 212 is amplified before being distributed to one or more components or devices in the vicinity of the piezoelectric transistor 212. In some embodiments, no amplification is needed and the output of the piezoelectric transistor 212 or a logic gate or circuit that the piezoelectric transistor 212 is a part of is used as a local clock signal that is distributed to components and circuits in the vicinity of the piezoelectric transistor. In some embodiments, the gate 224 of the piezoelectric transistor is floating (not connected to any electrical signal) and the piezoelectric transistor 212 is capable of producing an oscillating output clock signal through the transformation of a bulk acoustic signal received at the piezoelectric gate 224. In other embodiments, a conductive trace is connected to the piezoelectric gate 224 of the piezoelectric transistor 212 and the gate 224 is biased at a voltage at which the piezoelectric transistor 212 switches between an "on" and "off" state when the electric field generated across the gate by converting a received acoustic wave is superimposed on the bias voltage. The bias voltage applied to the gate can be a voltage such that an output clock signal generated by the piezoelectric transistor has a signal magnitude that can be utilized as a local clock signal to drive other components or devices in the vicinity of the piezoelectric transistor or that can be amplified or otherwise conditioned or processed to create a local clock signal. In some embodiments, the piezoelectric transistor 212 can be part of a clock-gated logic gate or other clocked circuitry, such as clocked sequential circuits or flip-flops.

A structure similar to structure 200 can be used for surface wave clock distribution. Such a structure can be similar to structure 200 but with the acoustic transmitter located on the same side of the substrate as the piezoelectric transistor. The piezoelectric transistor can generate an electrical signal in response to being activated by a surface acoustic wave generated by the acoustic transmitter located on the same surface of the substrate as the piezoelectric transistor.

Although a planar piezoelectric transistor 212 is illustrated in FIG. 2 (that is, the gate 224 is oriented substantially parallel to the surface 214 of the substrate 204), in other embodiments, the piezoelectric transistor could be a non-planar transistor, such as a FinFET or gate-all-around transistor.

The clock source signal 216 can be an external clock signal supplied to an integrated circuit component or a clock signal generated internal to an integrated circuit component (e.g., using a crystal oscillator) or derived from an external clock signal. For example, an integrated circuit component may comprise circuitry that multiplies or divides an external clock signal to generate a clock source signal. The acoustic clock distribution technologies described herein can distribute clock signals having a frequency of up to tens or hundreds of GHz. In some embodiments, the frequencies of clock signals distributed acoustically can be within the range of 100 MHz-10 GHz. In some embodiments, the frequencies of clock signals distributed acoustically can be within the range of 2-10 GHz. In some embodiments, where the substrate comprises bulk silicon, bulk acoustic waves can propagate through the substrate at a speed of approximately 3,000-9,000 m/s, depending on, for example, the crystal orientation of the silicon substrate (e.g., (100), (111), (110)) and/or substrate dopant concentration levels. The thickness of the substrate can be any thickness and in some embodiments can be about 50, 100, or 500 urn.

In some embodiments, acoustic transmitters can be fabricated on a first substrate that is different from a second substrate upon which transistors (e.g., MOSFETs) implementing functionality (e.g., CPU, GPU, memory functionality) of an integrated circuit component are fabricated. In such embodiments, the acoustic transmitters can be transferred from the first substrate to the second substrate. In other embodiments, the acoustic transmitters are fabricated on the same substrate upon which the transistors implementing functionality of an integrated circuit component are fabricated.

In some embodiments, acoustic transmitters can be located on the same side of the substrate as the piezoelectric elements that convert acoustic waves into electrical signals and the transistors (e.g., MOSFETs) that implement the functionality of an integrated circuit component. In such embodiments, the acoustic transmitters can be positioned adjacent to the surface of the substrate and generate surface waves that activate the piezoelectric elements or located within the metallization stack. For example, an acoustic transmitter can be located between metal layers in a metallization stack or occupy a portion of a metal layer. In some embodiments where the acoustic transmitters are positioned adjacent to the same substrate surface as the acoustic receivers, the acoustic transmitters generate bulk acoustic waves that transmit across the substrate, reflect off of the opposite surface of the substrate, and propagate back across the substrate where they are converted by piezoelectric elements to a local clock signal or an electronic signal from which a local clock signal can be derived.

In some embodiments, an acoustic wave comprises a series of pulses as an acoustic transmitter generates an acoustic pulse in response to a rising or falling edge of a clock source signal applied to the acoustic transmitter. A piezoelectric element receiving the acoustic wave can generate an electronic signal comprising a series of pulses in response to receiving the acoustic wave. Such a pulsed electrical signal can be converted into a local clock signal (e.g., a signal that oscillates between a high state and a low state) before it is provided to components and devices in the vicinity of the piezoelectric element.

Figure 3:
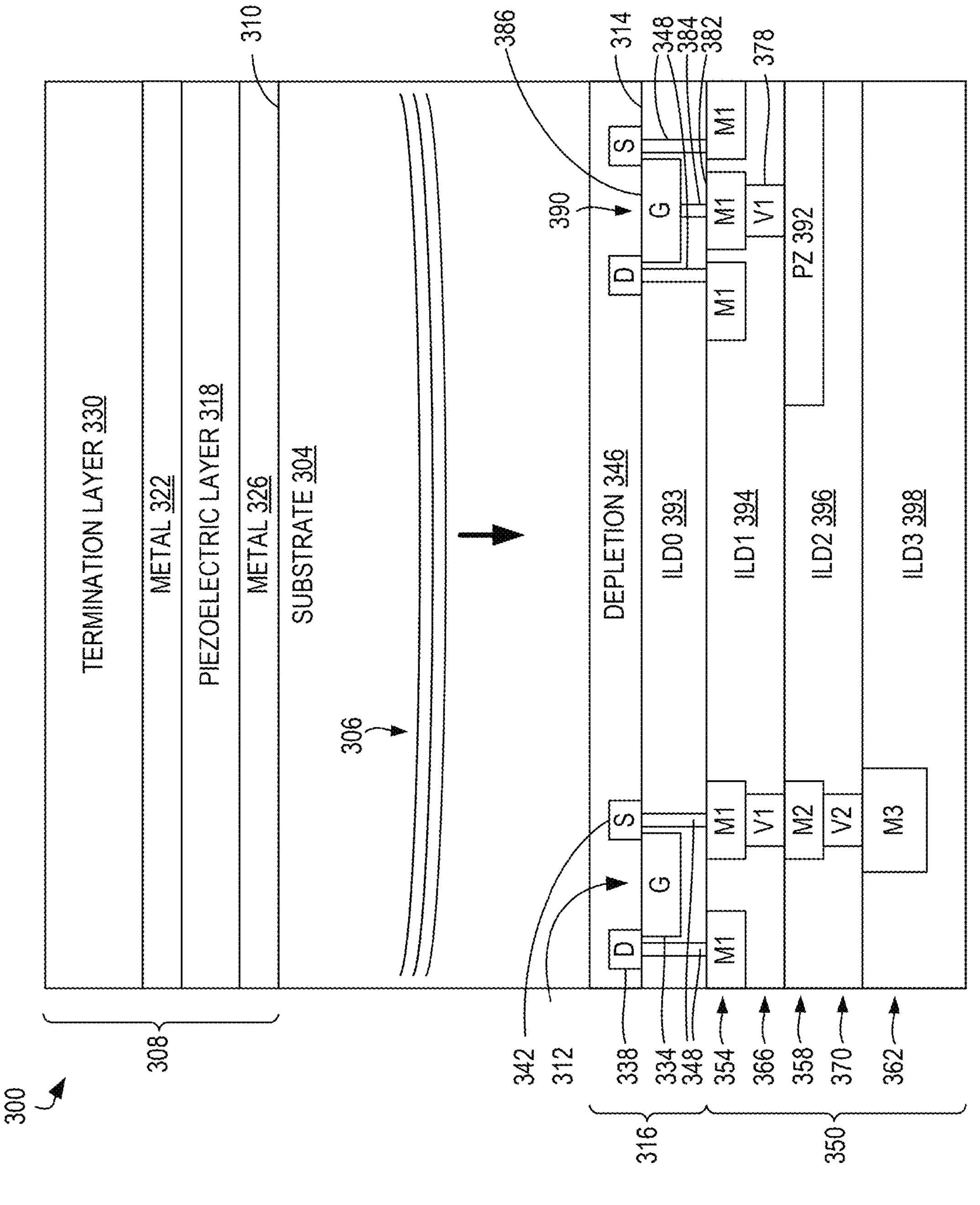
FIG. 3 illustrates a second example structure for bulk acoustic wave clock distribution.

FIG. 3 illustrates a second example structure for bulk acoustic wave clock distribution. The structure 300 comprises a substrate 304, an acoustic transmitter 308 located on a first surface 310 of the substrate 304, and a piezoelectric transistor 312 located on a second surface 314 of the substrate 304. A transistor layer 316 on the second surface 314 of the substrate 304 comprises the piezoelectric transistor 312 and other transistors (e.g., MOSFETs) that implement the functionality of the integrated circuit component. The acoustic transmitter 308 generates a bulk acoustic wave 306 based on a clock source signal applied to the acoustic transmitter 308. The bulk acoustic wave 306 propagates through the substrate 304 to the transistor layer 316.

The acoustic transmitter 308 comprises a piezoelectric layer 318 positioned between a first metal layer 322 and a second metal layer 326. A clock signal is applied across the first metal layer 322 and the second metal layer 326 to activate the piezoelectric layer 318. The first metal layer 322 comprises a first metal and the second metal layer 326 comprises a second metal. The first metal and the second metal can be the same or different metals. In some embodiments, the first metal and the second metal are molybdenum. A termination layer 330 is positioned adjacent to the first metal layer 322 and the piezoelectric layer 318 is positioned between the termination layer 330 and the substrate 304. The termination layer 330 comprises a material that has an acoustic impedance that substantially matches that of the substrate 304 such that the termination layer 330 absorbs at least a portion of the bulk acoustic wave generated by the piezoelectric layer 318 that propagates toward the termination layer 330 to reduce the magnitude of reflections of the bulk acoustic waves back to the substrate 304. In some embodiments, the termination layer 330 can comprise a suitable metal-epoxy composite (e.g., tungsten epoxy composite). In some embodiments, the termination layer can be a multi-layer structure comprising one or more metal layers alternating with one or more layers comprising an epoxy. In some embodiments, the acoustic transmitter 308 does not comprise a termination layer 330. In embodiments where clock signals are distributed via surface acoustic waves, a termination layer can be located at the substrate surface opposite the acoustic transmitters and receivers to absorb reflections from the substrate surface upon which the acoustic transmitter and receivers are located.

The piezoelectric transistor 312 comprises a gate 334 comprising a piezoelectric layer, a drain region 338, and a source region 342. The gate 334 and the drain and source regions 338 and 342 are similar to the gate 224 and the drain and source regions 228 and 232, respectively. The drain and source regions 338 and 342 are located in a depletion layer 346 of the substrate 304, which is defined by the presence of dopants having doping concentration profiles that at least partially sets the threshold voltages of the piezoelectric transistor and/or MOSFETs located in the transistor layer 316. In some embodiments, the piezoelectric transistor 312 can comprise an oxide layer positioned between the gate 334 and the depletion layer 346.

The structure 300 further comprises a metallization stack 350 comprising first metal (M1) layer 354, second metal (M2) layer 358, third metal (M3) layer 362, first via (V1) layer 366, and second via (V2) layer 370. Metal layers and individual traces on a given layer are separated from each other by an interlayer dielectric (ILD). A first interlayer dielectric (ILD0) 393 separates the first metal layer 354 from the substrate 304, a second interlayer dielectric (ILD1) 394 separates the second metal layer 358 from the first metal layer 354, a third interlayer dielectric (ILD2) 396 separates the third metal layer 362 from the second metal layer 358, and a fourth interlayer dielectric (ILD3) 398 separates the third metal layer 362 from a fourth metal layer (not shown). The metallization stack 350 is connected to the transistor layer by contacts 348.

In some embodiments, a piezoelectric element can be located within a metallization stack and generate an electrical signal that can be provided to local devices and components as a local clock signal or from which such a local clock signal can be derived. For example, piezoelectric element 392 comprises a layer of piezoelectric material and is located at the second metal (M2) layer 358. When the bulk acoustic waves 306 reach the surface 314 of the substrate 304, they can continue propagating through the metallization stack 350. The piezoelectric element 392 transforms the received bulk acoustic waves into an electrical signal that can be provided to components and devices in the vicinity of the piezoelectric element 392. For example, a via 378, M1 trace 382, and a contact 384 conductively couple the piezoelectric element 392 to a gate 386 of a MOSFET 390. Although the piezoelectric element 392 is shown at the M2 layer 358, a piezoelectric element positioned in a metallization stack could be positioned at any metal layer, via layer, or the contact layer. Further, the piezoelectric element could extend across one or more layers within the metallization stack. Moreover, the piezoelectric element can be any thickness. That is, the piezoelectric element can have a thickness that is the same or different than a metal, via, or contact layer. The gate 334 of the piezoelectric transistor 312 and the piezoelectric element 392 can comprise one or more of any of the piezoelectric materials described herein and/or any other suitable piezoelectric material.

A structure similar to 300 can be used for surface wave clock distribution Such a structure can be similar to structure 300 but with the acoustic transmitter located on the same substrate surface as the piezoelectric transistor. The piezoelectric transistor can generate an electrical signal in response to being activated by surface acoustic waves generated by an acoustic transmitter located on the same substrate surface as the piezoelectric transistor.

Figure 4:
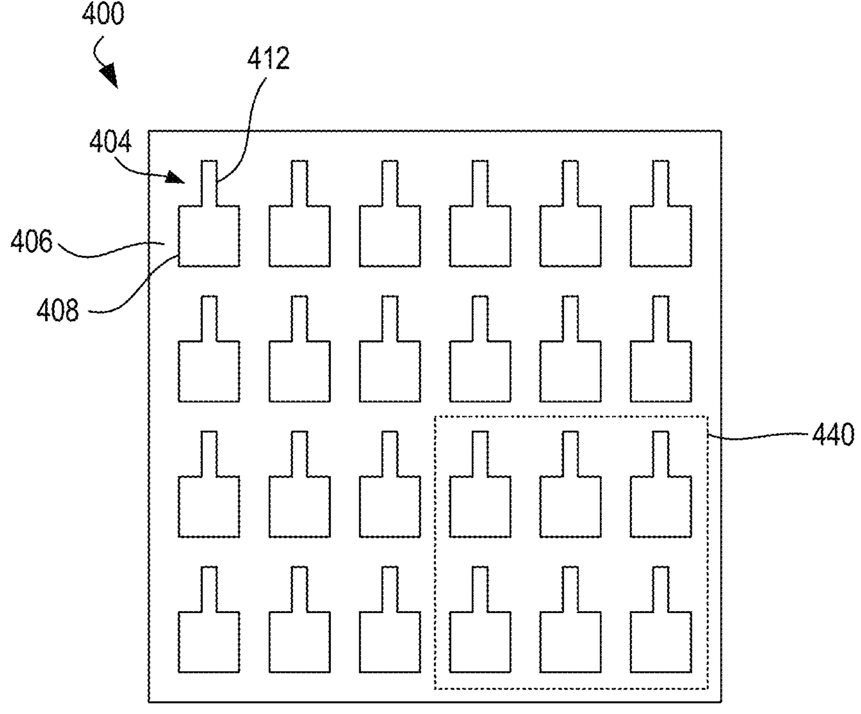
FIG. 4 is an example array of acoustic transmitters located on a substrate surface.

FIG. 4 is an example array of acoustic transmitters located on a substrate surface. The array 400 comprises a plurality of acoustic transmitters 404 arranged on a surface 406 of a substrate. The surface 406 can be a substrate surface opposite the substrate surface on which acoustic receivers (e.g., piezoelectric elements, piezoelectric transistors) are located or the same substrate surface on which acoustic receivers are located. Individual acoustic transmitters 404 comprise a lead 408 to which a conductive element (e.g., contact) that can provide a clock source signal can connect and a body 412. The body 412 comprises a layer of piezoelectric material that generates an acoustic wave when activated by a clock signal. The acoustic transmitters 404 can be electrically tied together and activated by a clock source signal. Thus, the individual acoustic transmitters resonate at the same frequency and in phase with each other, generating planar phononic waves that propagate across the substrate. As stated above, the frequency of the generated acoustic wave is a function of the thickness of the piezoelectric layer of the acoustic transmitters and the thickness of the piezoelectric layer can be chosen such that the resonant frequency of the piezoelectric layer substantially matches that of the clock source signal to be applied to the acoustic transmitters. The frequency of the generated acoustic wave can also be a function of the physical design of the piezoelectric layer as well as properties of the metal layers located on the piezoelectric layer. The physical design of the acoustic transmitters and the characteristics of the metal layers (e.g., thickness, material, shape) located on the piezoelectric layer can also be chosen such that the frequency of the acoustic wave generated by the piezoelectric layer substantially matches that of the clock source signal to be applied to the acoustic transmitters.

In embodiments where the acoustic transmitters are located on the substrate surface opposite the acoustic receivers, the planar bulk acoustic wave reaches the opposing surface of the substrate over the opposing surface at substantially the same time, allowing for local clock signals to be generated by piezoelectric elements at the opposing surface of the substrate that operate at the same frequency as the clock source signal and that are substantially in phase with each other. In some embodiments, the acoustic transmitters are conductively coupled to one or more coupling components (e.g., bond pads) of an integrated circuit component comprising the array 400, to which an external clock source signal can be provided to the integrated circuit component.

The bodies 412 of the acoustic transmitters are not limited to the "bar" shape shown and can be any suitable shape (e.g., disc-shaped, square, rectangular, hexagonal). Further, any arrangement of acoustic transmitters can comprise any number of acoustic transmitters 404. Moreover, the acoustic transmitters 404 can be arranged in any fashion and not just in the row-and-column configuration shown. In some embodiments, the number, size, and arrangement of the acoustic transmitters 404 can be based on the number, size, and arrangement of components and devices on the opposite surface of the substrate. For example, an arrangement of acoustic transmitters 404 can comprise two or more groups of transmitters that are aligned to the two or more regions of the components and device on the opposing surface of the substrate. For instance, an outer extent of a group of acoustic transmitters (e.g., 440) can be aligned with an outer extent of a processing core located on the opposite surface of the substrate.

Figure 5A:
FIGS. 5A-5B illustrate the impact of a termination layer in an acoustic transmitter.
Figure 5A:
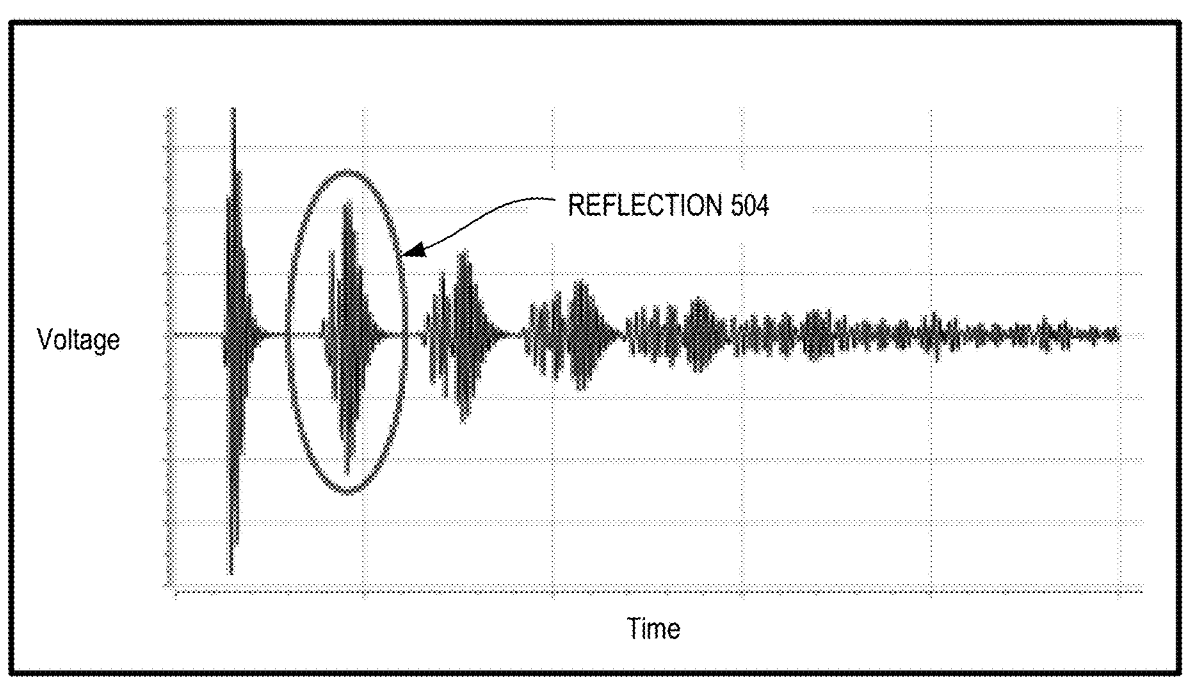
Figure 5B:
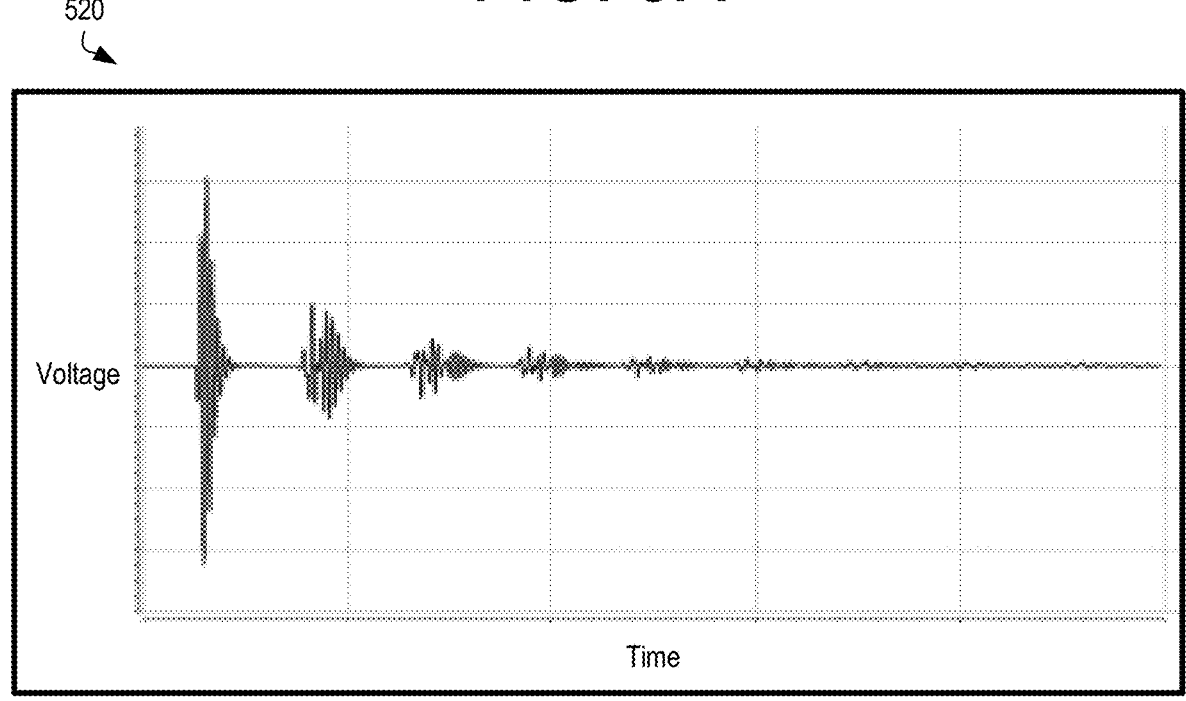

FIGS. 5A-5B illustrate the impact of a termination layer in an acoustic transmitter. FIGS. 5A and 5B illustrate the output voltage of an acoustic receiving converting a bulk acoustic wave to an electrical signal generated by an acoustic transmitter not having and having a termination layer, respectively, as a function of time. FIG. 5A shows a graph 500 illustrating the presence of reflections 504 in the output of the acoustic receiver receiving a bulk acoustic wave generated by an acoustic transmitter not comprising a termination layer. The reflections are due to mismatched densities between materials at the backside (the side of the acoustic transmitter opposite the substrate) of the acoustic transmitter. FIG. 5B shows a graph 520 illustrating that the presence of a termination layer at the acoustic transmitter dampens reflections in the output due to better matching of material densities at the backside of the acoustic transmitter.

Figure 6A:
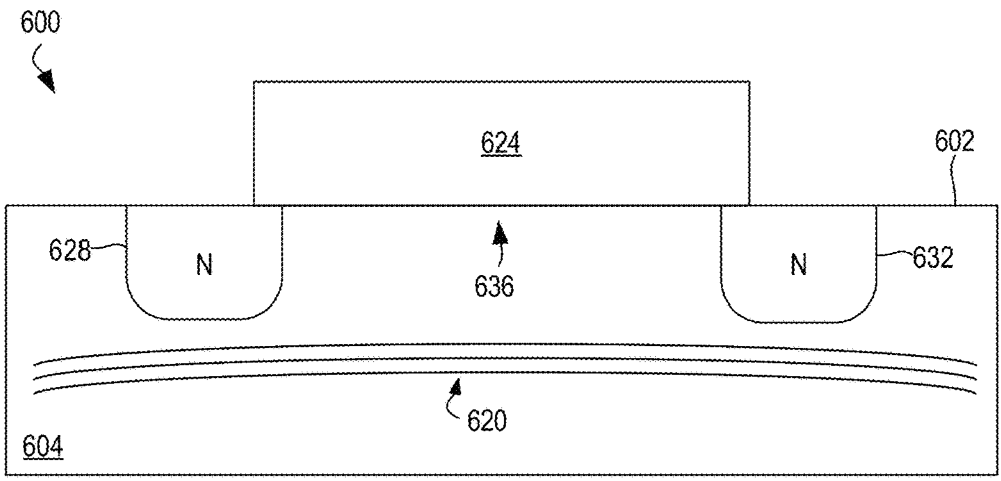
FIGS. 6A-6C illustrate operation of an example piezoelectric transistor.
Figure 6B:
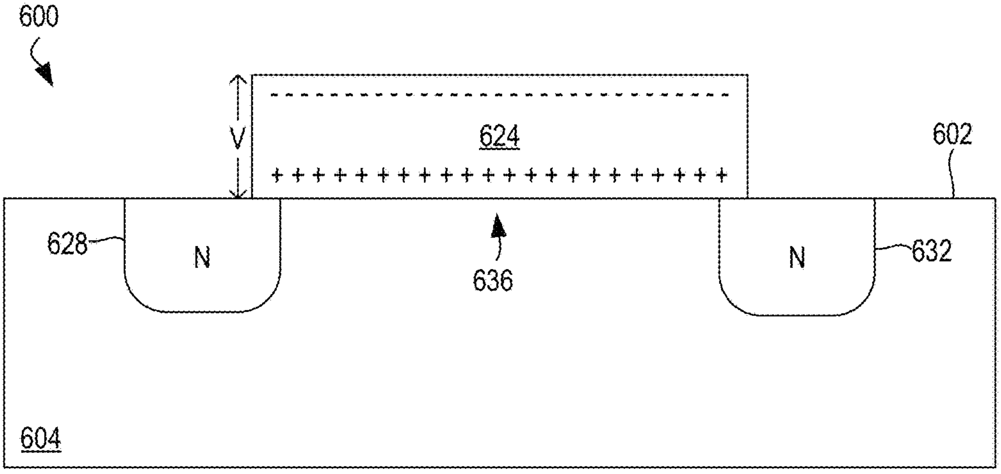
Figure 6C:
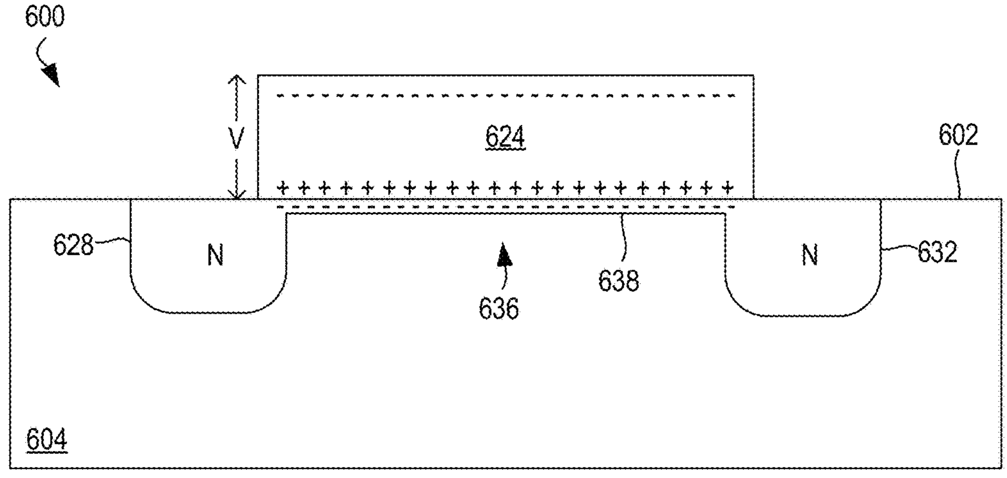

FIGS. 6A-6C illustrate operation of an example piezoelectric transistor. The piezoelectric transistor 600 is an n-type transistor located on a first surface 602 of a substrate 604. The piezoelectric transistor 600 comprises a piezoelectric gate 624, n-type source and drain regions 628 and 632, respectively, and channel region 636. FIG. 6A illustrates a bulk acoustic wave 620 generated by an acoustic transmitter (not shown) positioned on a second surface of the substrate 604 opposite the first surface 602. FIG. 6B illustrates polarization of the piezoelectric gate 624 in response to mechanical pressure applied to the gate 624 as a result of the bulk acoustic wave 620 reaching the gate 624. The polarization of the piezoelectric gate 624 induces an electric field in the gate 624, which generates a voltage (V) across the gate 624. FIG. 6C shows the creation of a low-resistance channel layer 638 due to the attraction of charge carriers (electrons for the n-type piezoelectric transistor 600) to the piezoelectric gate 624 by the gate voltage. The creation of the channel layer 638 enables the flow of current from the drain region 632 to the source region 628. As the magnitude of the gate voltage varies in response to the amount of mechanical pressure applied to the gate 624 by the oscillating acoustic wave 620, the conductivity of the channel region 636 varies as the piezoelectric transistor 600 switches between an "on" state (a lower-resistance channel region 638 is present) and an "off" state (the channel region 638 not present). The varying conductivity through the channel region 636 (or a resulting varying voltage at the drain 632) can be used to generate a local clock signal for components or devices in the vicinity of the piezoelectric transistor 600 or to generate a signal from which such a local clock signal can be derived. In some embodiments, a piezoelectric transistor comprises an oxide layer (e.g., a layer comprising oxygen) between the piezoelectric gate 624 and the channel region 636 (gate oxide layer). The gate oxide layer can extend from the source region to the drain region of the piezoelectric transistor. A piezoelectric transistor comprising a gate oxide layer operates in a similar manner to the operation of the piezoelectric transistor 600 not having a gate oxide layer as illustrated in FIGS. 6A-6C.

The operation of the piezoelectric transistor 600 is similar if a surface wave clock distribution approach is employed. That is, the conductivity of the channel region 636 varies in response to mechanical pressure applied to the gate 624 by a surface acoustic wave generated by an acoustic transmitter located on the first surface 602 reaching the gate 624.

Figure 7:
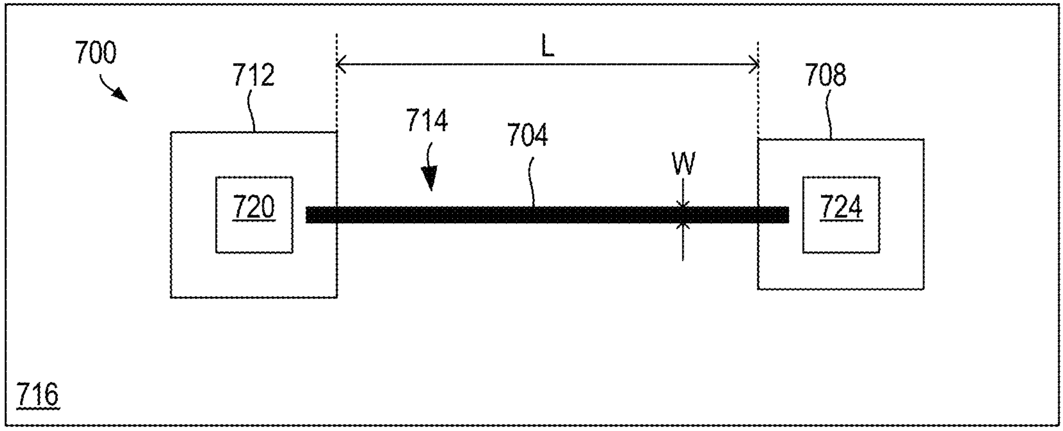
FIG. 7 illustrates an example top-down design of a piezoelectric transistor.

FIG. 7 illustrates an example top view of a piezoelectric transistor. The piezoelectric transistor 700 can be any of the piezoelectric transistors described herein (e.g., 212, 312) and comprises a piezoelectric gate 704, a drain region 708, a source region 712, and a channel region 714. The piezoelectric transistor 700 is located on a surface 716 of a substrate. Source contact 720 and drain contact 724 provide connections to the source region 712 and the drain region 708, respectively, from metal traces that can carry electrical signals, such as ground or an electrical signal generated by the piezoelectric transistor 700 (e.g., a local clock signal or a signal from which a local clock signal can be derived). FIG. 7 shows just one possible piezoelectric transistor design. The width (W) and length (L) of the piezoelectric gate 704 can be chosen such that the piezoelectric transistor 700 generates an electrical signal having one or more desired characteristics when activated by an acoustic wave. In some embodiments, the width (W) of the piezoelectric gate is 120 nm. In another embodiment, the width (W) of the piezoelectric gate is 2 um. FIG. 7 illustrates a single piezoelectric gate 704 extending from the source region 712 to the drain region 708, but in other embodiments, two or more piezoelectric gates can extend from a drain region to a source region.

During operation of an integrated circuit component, heat-generating components of the integrated circuit component (e.g., transistors) can cause the temperature of the substrate to increase in the vicinity of the heat-generating components that are in operation. As the propagation velocity of a bulk acoustic wave across the substrate is temperature-dependent, the propagation delay of an acoustic wave across the thickness of a substrate can vary over the surface of the substrate. The propagation delay of an acoustic wave across a bulk silicon substrate having a thickness of about 50 um decreases by about 0.6 ps/degree. The temperature dependency of the propagation delay may be different for different substrate materials. The propagation of surface acoustic waves can also exhibit a temperature dependency. As different heat-generating components of an integrated circuit component can be in operation at different times during operation of an integrated circuit component, temperature gradients can develop in the substrate. This can lead to a difference in bulk acoustic wave propagation times across the substrate. In some embodiments, this temperature-gradient induced variation in bulk acoustic wave propagation delay across the thickness of the substrate can be compensated for by varying the time at which a bulk acoustic wave is launched from individual acoustic transmitters.

In some embodiments, an acoustic transmitter controller can cause a bulk acoustic wave to launch from different acoustic transmitters at different times. The delay between the launch of acoustic waves at different acoustic transmitters can be based on information indicating a temperature gradient (temperature gradient information) in the integrated circuit component (e.g., across the surface of the substrate upon which the transistor layer is located). Temperature gradient information can be determined based on, for example, information indicating a temperature at two or more locations in an integrated circuit component. Information indicating a temperature in an integrated circuit component can be generated by, for example, a temperature sensor located in the integrated circuit component. The information indicating a temperature gradient can further comprise information indicating an absolute or relative physical location of a temperature sensor. The acoustic transmitter controller can cause the launch of an acoustic wave from a first acoustic transmitter to be delayed relative to a second acoustic transmitter based on temperature gradient information. In some embodiments, the delay can be based on the difference between the temperature at two locations in the integrated circuit component. In other embodiments, the delay can be based on a first temperature determined for one or more first acoustic transmitters and a second temperature determined for one or more second acoustic transmitters, the first and second temperatures determined from one or more temperatures in the integrated circuit component (the first and second temperatures can be determined from the same or different sets of temperatures in the integrated circuit component). In some embodiments, the delay can be based on location information associated with the first acoustic transmitter, location information associated with the second acoustic transmitter, and/or location information associated with one or more temperature sensors. The acoustic transmitter controller can comprise software, hardware, firmware, or any combination thereof. The acoustic transmitter controller can be located on the same integrated circuit die as the acoustic transmitters controlled by the acoustic transmitter controller, on a different integrated circuit die, or within a different integrated circuit component.

Figure 8:
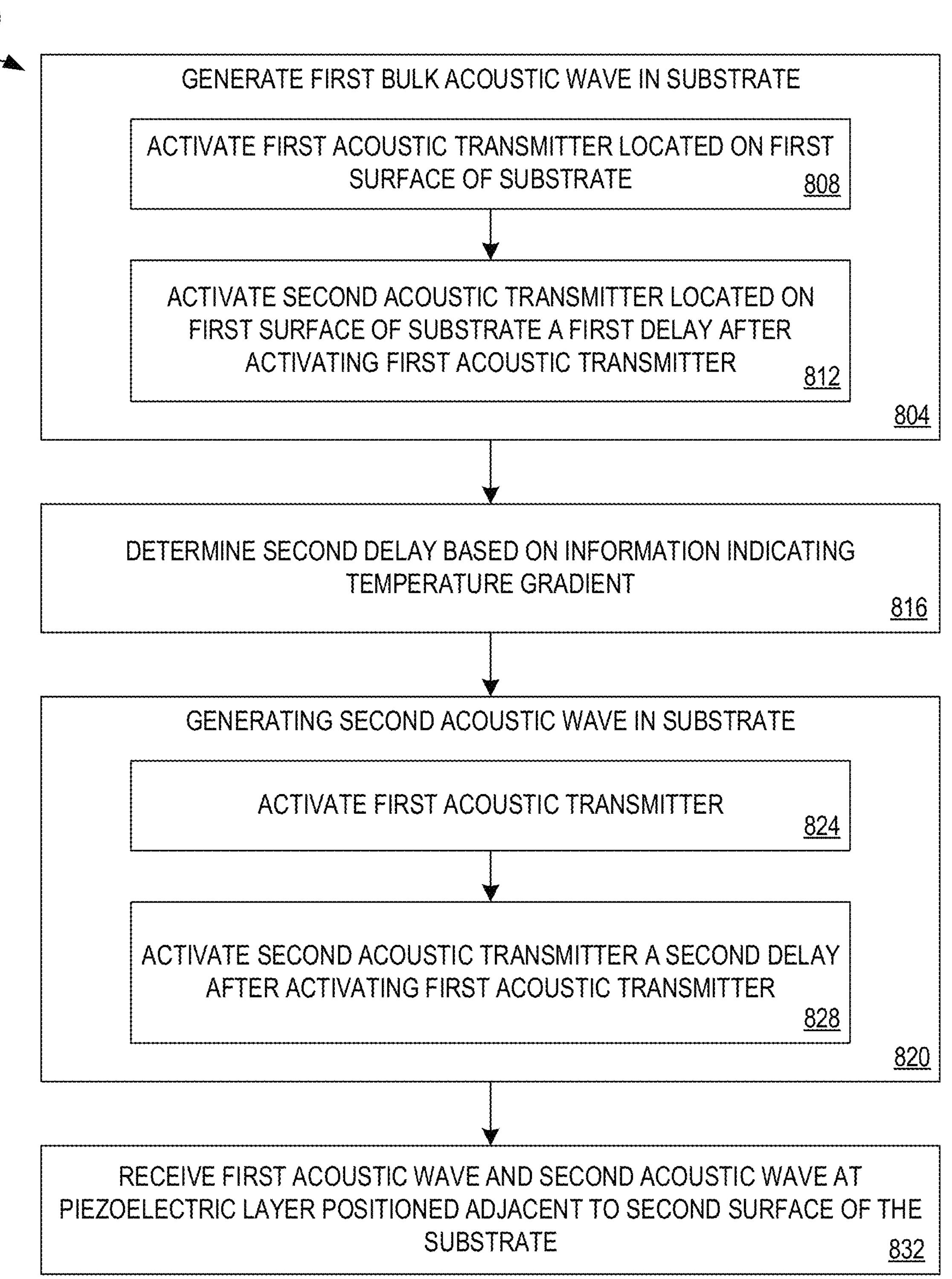
FIG. 8 is an example acoustic clock signal distribution method that compensates for temperature gradients in a substrate.

FIG. 8 is an example acoustic clock signal distribution method that compensates for temperature gradients in a substrate. The method 800 can be performed by an integrated circuit component in which a clock source signal is distributed acoustically. At 804, a first bulk acoustic wave is generated in a substrate comprising a semiconductor. Generating the first acoustic wave comprises, at 808, activating a first acoustic transmitter located on a first surface of the substrate and, at 812, activating a second acoustic transmitter located on the first surface of the substrate a first delay after activating the first acoustic transmitter. At 816, a second delay is determined based on information indicating a temperature gradient in an integrated circuit component comprising the substrate. At 820, a second acoustic wave is generated in the substrate. The generating the second acoustic wave comprises, at 824, activating the first acoustic transmitter and, at 828, activating the second acoustic transmitter the second delay after activating the first acoustic transmitter, the second delay being different than the first delay. At 832, the first acoustic wave and the second acoustic wave are received at a piezoelectric layer positioned adjacent to a second surface of the substrate, the second surface opposite the first surface. A first region of the substrate comprises a first portion of the second surface of the substrate, a second region of the substrate comprises a second portion of the second surface of the substrate, a third region of the substrate comprises a third portion of the second surface of the substrate. Both the first region and the second region are n-type or p-type, the third region being n-type if the first region and the second region are p-type, the third region being p-type if the first region and the second region are n-type. The piezoelectric layer is positioned adjacent to the third region of the second surface of the substrate and extends from the first portion of the substrate to the second portion of the substrate. In other embodiments, the method 800 can comprise one or more additional elements.

The acoustic clock distribution technologies described herein can be used in any processor unit or integrated circuit component described or referenced herein. An integrated circuit component comprising acoustic clock distribution technologies as described herein can be attached to a printed circuit board. In some embodiments, one or more additional integrated circuit components or other components (e.g., a battery) can be attached to the circuit board. In some embodiments, the printed circuit board and the integrated circuit component can be located in a computing device that comprises a housing that encloses the printed circuit board and the integrated circuit component.

Figure 9:
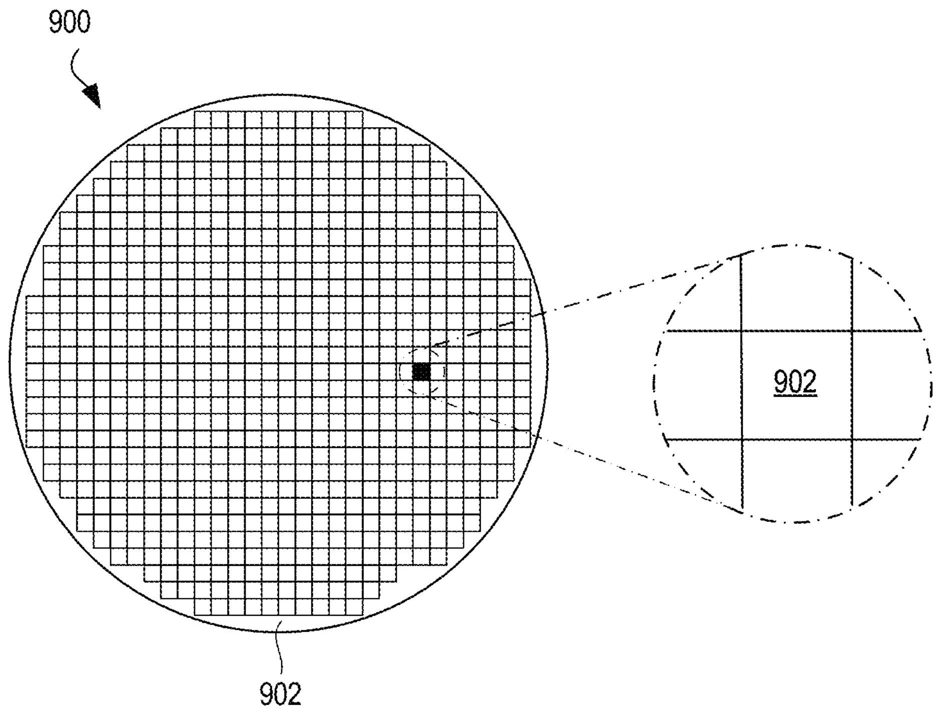
FIG. 9 is a top view of a wafer and dies that may be included in a microelectronic assembly, in accordance with any of the embodiments disclosed herein.

FIG. 9 is a top view of a wafer 900 and dies 902 that may include any of the acoustic wave distribution technologies disclosed herein. The wafer 900 may be composed of semiconductor material and may include one or more dies 902 having integrated circuit structures formed on a surface of the wafer 900. The individual dies 902 may be a repeating unit of an integrated circuit product that includes any suitable integrated circuit. After the fabrication of the semiconductor product is complete, the wafer 900 may undergo a singulation process in which the dies 902 are separated from one another to provide discrete "chips" of the integrated circuit product. The die 902 may include one or more transistors (e.g., some of the transistors 1040 of FIG. 10, discussed below), supporting circuitry to route electrical signals to the transistors, passive components (e.g., signal traces, resistors, capacitors, or inductors), and/or any other integrated circuit components. In some embodiments, the wafer 900 or the die 902 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 902. For example, a memory array formed by multiple memory devices may be formed on a same die 902 as a processor unit (e.g., the processor unit 1302 of FIG. 13) or other logic that is configured to store information in the memory devices or execute instructions stored in the memory array. Various ones of the microelectronic assemblies disclosed herein may be manufactured using a die-to-wafer assembly technique in which some dies 902 are attached to a wafer 900 that include others of the dies 902, and the wafer 900 is subsequently singulated.

Figure 10:
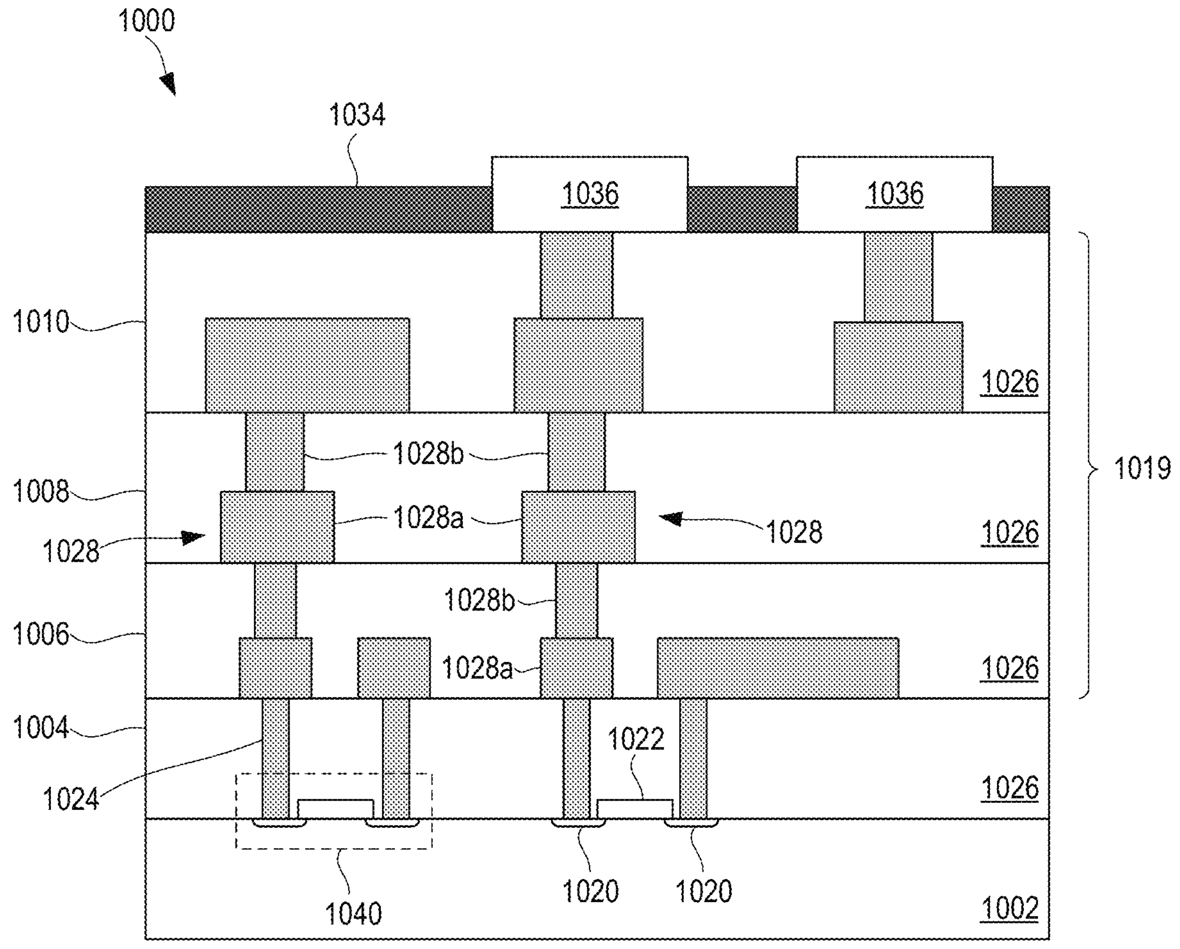
FIG. 10 is a cross-sectional side view of an integrated circuit device that may be included in a microelectronic assembly, in accordance with any of the embodiments disclosed herein.

FIG. 10 is a cross-sectional side view of an integrated circuit device 1000 that may be included in any of the integrated circuit components disclosed herein. One or more of the integrated circuit devices 1000 may be included in one or more dies 902 (FIG. 9). The integrated circuit device 1000 may be formed on a die substrate 1002 (e.g., the wafer 900 of FIG. 9) and may be included in a die (e.g., the die 902 of FIG. 9). The die substrate 1002 may be a semiconductor substrate composed of semiconductor material systems including, for example, n-type or p-type materials systems (or a combination of both). The die substrate 1002 may include, for example, a crystalline substrate formed using a bulk silicon or a silicon-on-insulator (SOI) substructure. In some embodiments, the die substrate 1002 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1002. Although a few examples of materials from which the die substrate 1002 may be formed are described here, any material that may serve as a foundation for an integrated circuit device 1000 may be used. The die substrate 1002 may be part of a singulated die (e.g., the dies 902 of FIG. 9) or a wafer (e.g., the wafer 900 of FIG. 9).

The integrated circuit device 1000 may include one or more device layers 1004 disposed on the die substrate 1002 (e.g., substrate 204, 304, 604). The device layer 1004 may include features of one or more transistors 1040 (e.g., MOSFETs) formed on the die substrate 1002. The transistors 1040 may include, for example, one or more source and/or drain (S/D) regions 1020, a gate 1022 to control current flow between the S/D regions 1020, and one or more S/D contacts 1024 to route electrical signals to/from the S/D regions 1020. The transistors 1040 may include additional features not depicted for the sake of clarity, such as device isolation regions, gate contacts, and the like. The transistors 1040 are not limited to the type and configuration depicted in FIG. 10 and may include a wide variety of other types and configurations such as, for example, planar transistors, non-planar transistors, or a combination of both. Non-planar transistors may include FinFET transistors, such as double-gate transistors or tri-gate transistors, and wrap-around or gate all-around transistors, such as nanoribbon, nanosheet, or nanowire transistors.

FIGS. 11A-11D are simplified perspective views of example planar, FinFET, gate-all-around, and stacked gate-all-around transistors. The transistors illustrated in FIGS. 11A-11D are formed on a substrate 1116 having a surface 1108. Isolation regions 1114 separate the source and drain regions of the transistors from other transistors and from a bulk region 1118 of the substrate 1116.

Figures 11A, 11B, 11C, 11D:
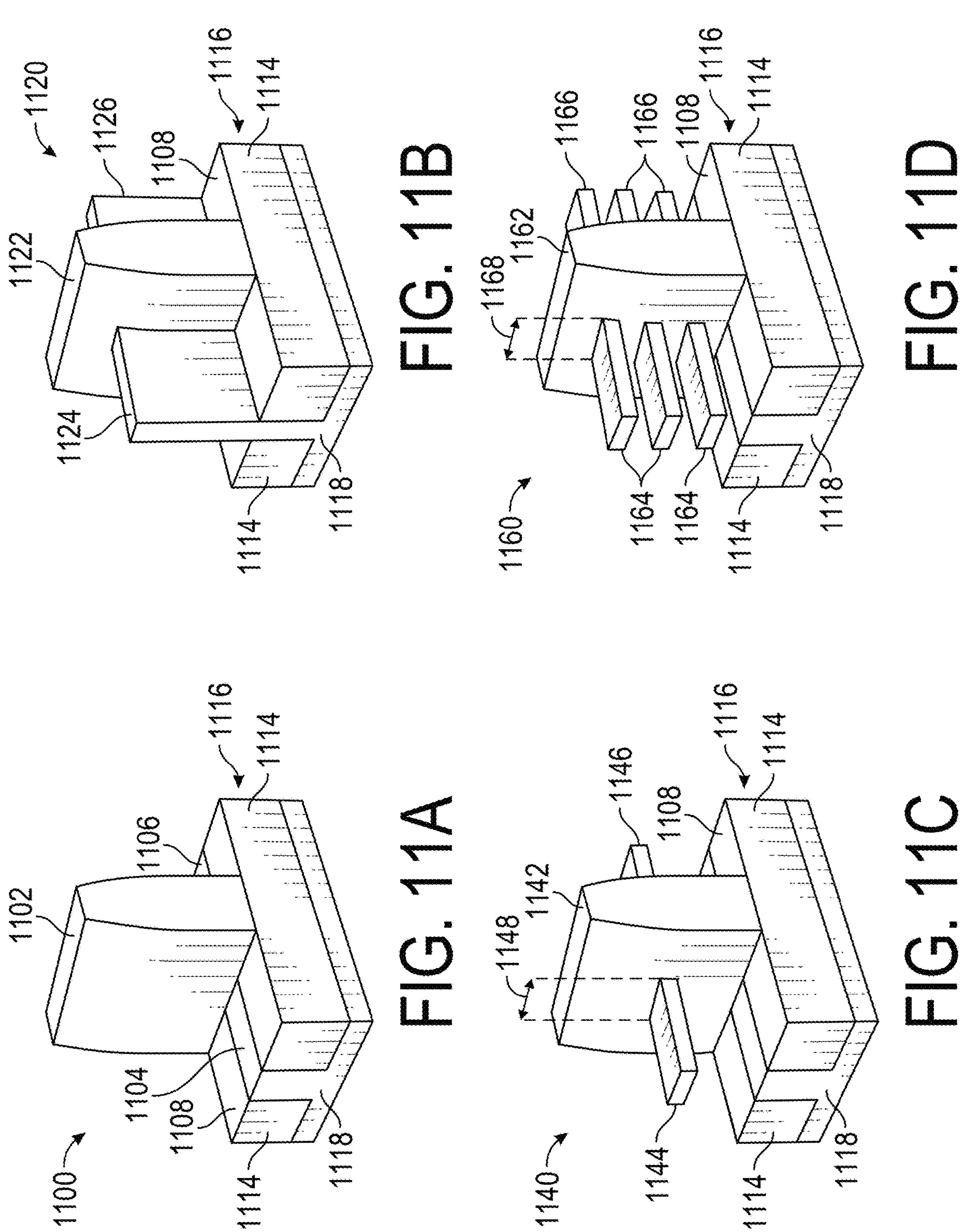
FIGS. 11A-11D are perspective views of example planar, FinFET, gate-all-around, and stacked gate-all-around transistors.

FIG. 11A is a perspective view of an example planar transistor 1100 comprising a gate 1102 that controls current flow between a source region 1104 and a drain region 1106. The transistor 1100 is planar in that the source region 1104 and the drain region 1106 are planar with respect to the substrate surface 1108.

FIG. 11B is a perspective view of an example FinFET transistor 1120 comprising a gate 1122 that controls current flow between a source region 1124 and a drain region 1126. The transistor 1120 is non-planar in that the source region 1124 and the drain region 1126 comprise a "fin" that extends upward from the substrate surface 1108. As the gate 1122 encompasses three sides of the semiconductor fin that extends from the source region 1124 to the drain region 1126, the transistor 1120 can be considered a tri-gate transistor. FIG. 11B illustrates one S/D fin extending through the gate 1122, but multiple S/D fins can extend through the gate of a FinFET transistor.

FIG. 11C is a perspective view of a gate-all-around (GAA) transistor 1140 comprising a gate 1142 that controls current flow between a source region 1144 and a drain region 1146. The transistor 1140 is non-planar in that the source region 1144 and the drain region 1146 are elevated from the substrate surface 1108.

FIG. 11D is a perspective view of a GAA transistor 1160 comprising a gate 1162 that controls current flow between multiple elevated source regions 1164 and multiple elevated drain regions 1166. The transistor 1160 is a stacked GAA transistor as the gate controls the flow of current between multiple elevated S/D regions stacked on top of each other. The transistors 1140 and 1160 are considered gate-all-around transistors as the gates encompass all sides of the semiconductor portions that extends from the source regions to the drain regions. The transistors 1140 and 1160 can alternatively be referred to as nanowire, nanosheet, or nanoribbon transistors depending on the width (e.g., widths 1148 and 1168 of transistors 1140 and 1160, respectively) of the semiconductor portions extending through the gate.

Returning to FIG. 10, a transistor 1040 may include a gate 1022 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1040 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1040 along the source-channel-drain direction, the gate electrode may consist of a U-shaped structure that includes a bottom portion substantially parallel to the surface of the die substrate 1002 and two sidewall portions that are substantially perpendicular to the top surface of the die substrate 1002. In other embodiments, at least one of the metal layers that form the gate electrode may simply be a planar layer that is substantially parallel to the top surface of the die substrate 1002 and does not include sidewall portions substantially perpendicular to the top surface of the die substrate 1002. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1020 may be formed within the die substrate 1002 adjacent to the gate 1022 of individual transistors 1040. The S/D regions 1020 may be formed using an implantation/diffusion process or an etching/deposition process, for example. In the former process, dopants such as boron, aluminum, antimony, phosphorous, or arsenic may be ion-implanted into the die substrate 1002 to form the S/D regions 1020. An annealing process that activates the dopants and causes them to diffuse farther into the die substrate 1002 may follow the ion-implantation process. In the latter process, the die substrate 1002 may first be etched to form recesses at the locations of the S/D regions 1020. An epitaxial deposition process may then be carried out to fill the recesses with material that is used to fabricate the S/D regions 1020. In some implementations, the S/D regions 1020 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1020 may be formed using one or more alternate semiconductor materials such as germanium or a group III-V material or alloy. In further embodiments, one or more layers of metal and/or metal alloys may be used to form the S/D regions 1020.

Electrical signals, such as power and/or input/output (I/O) signals, may be routed to and/or from the devices (e.g., transistors 1040) of the device layer 1004 through one or more interconnect layers disposed on the device layer 1004 (illustrated in FIG. 10 as interconnect layers 1006-1010). For example, electrically conductive features of the device layer 1004 (e.g., the gate 1022 and the S/D contacts 1024) may be conductively coupled with the interconnect structures 1028 of the interconnect layers 1006-1010. The one or more interconnect layers 1006-1010 may form a metallization stack (also referred to as an "ILD stack") 1019 of the integrated circuit device 1000.

The interconnect structures 1028 may be arranged within the interconnect layers 1006-1010 to route electrical signals according to a wide variety of designs; in particular, the arrangement is not limited to the particular configuration of interconnect structures 1028 depicted in FIG. 10. Although a particular number of interconnect layers 1006-1010 is depicted in FIG. 10, embodiments of the present disclosure include integrated circuit devices having more or fewer interconnect layers than depicted.

In some embodiments, the interconnect structures 1028 may include lines **1028*a* and/or vias 1028*b* filled with an electrically conductive material such as a metal. The lines 1028*a* may be arranged to route electrical signals in a direction of a plane that is substantially parallel with a surface of the die substrate 1002 upon which the device layer 1004 is formed. For example, the lines 1028*a* may route electrical signals in a direction in and out of the page and/or in a direction across the page from the perspective of FIG. 10. The vias 1028*b* may be arranged to route electrical signals in a direction of a plane that is substantially perpendicular to the surface of the die substrate 1002 upon which the device layer 1004 is formed. In some embodiments, the vias 1028*b* may electrically couple lines 1028*a* of different interconnect layers 1006-1010** together.

The interconnect layers 1006-1010 may include a dielectric material 1026 disposed between the interconnect structures 1028, as shown in FIG. 10. In some embodiments, dielectric material 1026 disposed between the interconnect structures 1028 in different ones of the interconnect layers 1006-1010 may have different compositions; in other embodiments, the composition of the dielectric material 1026 between different interconnect layers 1006-1010 may be the same. The device layer 1004 may include a dielectric material 1026 (e.g., interlayer dielectric layers ILD0, ILD1, ILD2, ILD3 in FIG. 3) disposed between the transistors 1040 and a bottom layer of the metallization stack as well. The dielectric material 1026 included in the device layer 1004 may have a different composition than the dielectric material 1026 included in the interconnect layers 1006-1010; in other embodiments, the composition of the dielectric material 1026 in the device layer 1004 may be the same as a dielectric material 1026 included in any one of the interconnect layers 1006-1010.

A first interconnect layer 1006 (referred to as Metal 1 or "M1") may be formed directly on the device layer 1004. In some embodiments, the first interconnect layer 1006 may include lines **1028*a* and/or vias 1028*b*, as shown. The lines 1028*a* of the first interconnect layer 1006 may be coupled with contacts (e.g., the S/D contacts 1024) of the device layer 1004. The vias 1028*b* of the first interconnect layer 1006 may be coupled with the lines 1028*a* of a second interconnect layer 1008**.

The second interconnect layer 1008 (referred to as Metal 2 or "M2") may be formed directly on the first interconnect layer 1006. In some embodiments, the second interconnect layer 1008 may include via 1028*b* to couple the lines 1028 of the second interconnect layer 1008 with the lines 1028*a* of a third interconnect layer 1010. Although the lines 1028*a* and the vias 1028*b* are structurally delineated with a line within individual interconnect layers for the sake of clarity, the lines 1028*a* and the vias 1028*b* may be structurally and/or materially contiguous (e.g., simultaneously filled during a dual-damascene process) in some embodiments.

The third interconnect layer 1010 (referred to as Metal 3 or "M3") (and additional interconnect layers, as desired) may be formed in succession on the second interconnect layer 1008 according to similar techniques and configurations described in connection with the second interconnect layer 1008 or the first interconnect layer 1006. In some embodiments, the interconnect layers that are "higher up" in the metallization stack 1019 in the integrated circuit device 1000 (i.e., farther away from the device layer 1004) may be thicker than the interconnect layers that are lower in the metallization stack 1019, with lines 1028*a* and vias 1028*b* in the higher interconnect layers being thicker than those in the lower interconnect layers.

The integrated circuit device 1000 may include a solder resist material 1034 (e.g., polyimide or similar material) and one or more conductive contacts 1036 formed on the interconnect layers 1006-1010. In FIG. 10, the conductive contacts 1036 are illustrated as taking the form of bond pads. The conductive contacts 1036 may be conductively coupled with the interconnect structures 1028 and configured to route the electrical signals of the transistor(s) 1040 to external devices. For example, solder bonds may be formed on the one or more conductive contacts 1036 to mechanically and/or conductively couple an integrated circuit die including the integrated circuit device 1000 with another component (e.g., a printed circuit board). The integrated circuit device 1000 may include additional or alternate structures to route the electrical signals from the interconnect layers 1006-1010; for example, the conductive contacts 1036 may include other analogous features (e.g., posts) that route the electrical signals to external components.

In some embodiments in which the integrated circuit device 1000 is a double-sided die, the integrated circuit device 1000 may include another metallization stack (not shown) on the opposite side of the device layer(s) 1004. This metallization stack may include multiple interconnect layers as discussed above with reference to the interconnect layers 1006-1010, to provide conductive pathways (e.g., including conductive lines and vias) between the device layer(s) 1004 and additional conductive contacts (not shown) on the opposite side of the integrated circuit device 1000 from the conductive contacts 1036.

In other embodiments in which the integrated circuit device 1000 is a double-sided die, the integrated circuit device 1000 may include one or more through silicon vias (TSVs) through the die substrate 1002; these TSVs may make contact with the device layer(s) 1004, and may provide conductive pathways between the device layer(s) 1004 and additional conductive contacts (not shown) on the opposite side of the integrated circuit device 1000 from the conductive contacts 1036. In some embodiments, TSVs extending through the substrate can be used for routing power and ground signals from conductive contacts on the opposite side of the integrated circuit device 1000 from the conductive contacts 1036 to the transistors 1040 and any other components integrated into the die 1000, and the metallization stack 1019 can be used to route I/O signals from the conductive contacts 1036 to transistors 1040 and any other components integrated into the die 1000.

Multiple integrated circuit devices 1000 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 12:
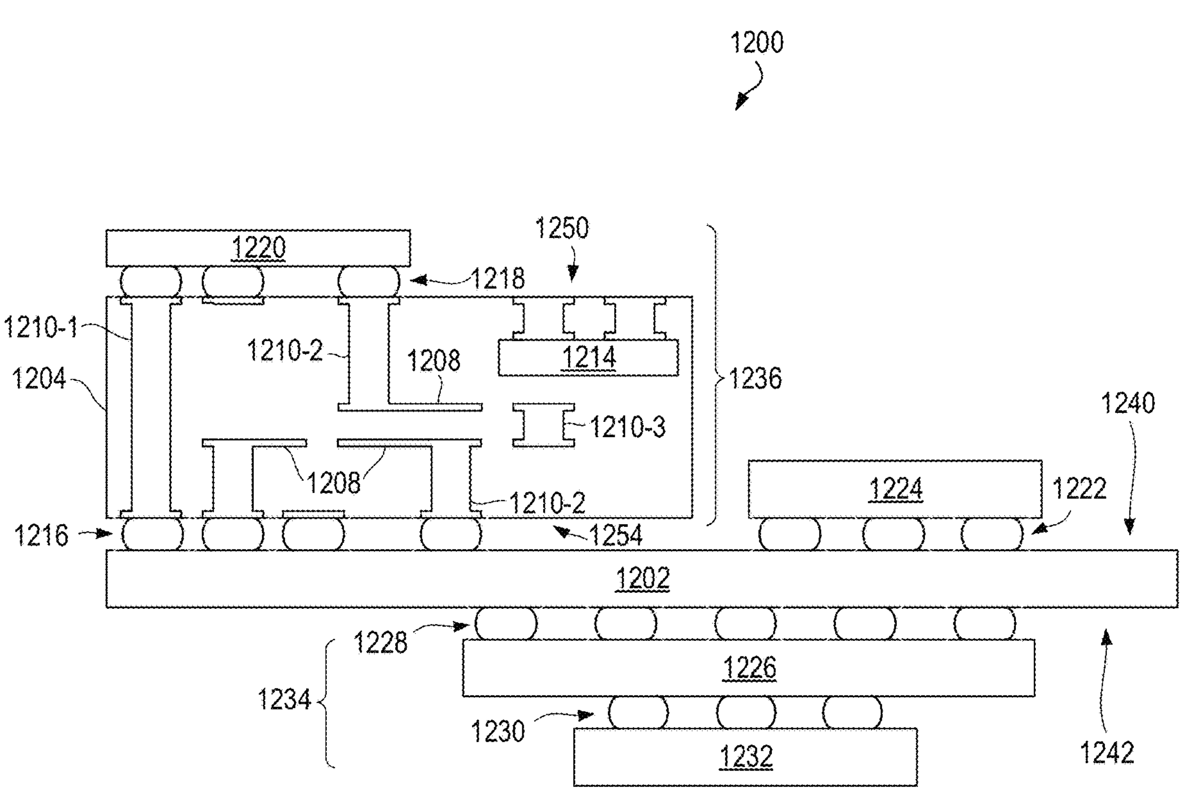
FIG. 12 is a cross-sectional side view of an integrated circuit device assembly that may include a microelectronic assembly, in accordance with any of the embodiments disclosed herein.

FIG. 12 is a cross-sectional side view of an integrated circuit device assembly 1200 that may include any of the microelectronic assemblies disclosed herein. The integrated circuit device assembly 1200 includes a number of components disposed on a circuit board 1202 (which may be a motherboard, system board, mainboard, etc.). The integrated circuit device assembly 1200 includes components disposed on a first face 1240 of the circuit board 1202 and an opposing second face 1242 of the circuit board 1202; generally, components may be disposed on one or both faces 1240 and 1242. Any of the integrated circuit components discussed below with reference to the integrated circuit device assembly 1200 may take the form of any suitable ones of the embodiments of the microelectronic assemblies disclosed herein.

In some embodiments, the circuit board 1202 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1202. In other embodiments, the circuit board 1202 may be a non-PCB substrate. The integrated circuit device assembly 1200 illustrated in FIG. 12 includes a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1236 may include an integrated circuit component 1220 coupled to an interposer 1204 by coupling components 1218. The coupling components 1218 may take any suitable form for the application, such as the forms discussed above with reference to the coupling components 1216. Although a single integrated circuit component 1220 is shown in FIG. 12, multiple integrated circuit components may be coupled to the interposer 1204; indeed, additional interposers may be coupled to the interposer 1204. The interposer 1204 may provide an intervening substrate used to bridge the circuit board 1202 and the integrated circuit component 1220.

The integrated circuit component 1220 may be a packaged or unpacked integrated circuit product that includes one or more integrated circuit dies (e.g., the die 902 of FIG. 9, the integrated circuit device 1000 of FIG. 10) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1220, a single monolithic integrated circuit die comprises solder bumps attached to contacts on the die. The solder bumps allow the die to be directly attached to the interposer 1204. The integrated circuit component 1220 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1220 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1220 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1220 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1204 may spread connections to a wider pitch or reroute a connection to a different connection. For example, the interposer 1204 may couple the integrated circuit component 1220 to a set of ball grid array (BGA) conductive contacts of the coupling components 1216 for coupling to the circuit board 1202. In the embodiment illustrated in FIG. 12, the integrated circuit component 1220 and the circuit board 1202 are attached to opposing sides of the interposer 1204; in other embodiments, the integrated circuit component 1220 and the circuit board 1202 may be attached to a same side of the interposer 1204. In some embodiments, three or more components may be interconnected by way of the interposer 1204.

In some embodiments, the interposer 1204 may be formed as a PCB, including multiple metal layers separated from one another by layers of dielectric material and interconnected by electrically conductive vias. In some embodiments, the interposer 1204 may be formed of an epoxy resin, a fiberglass-reinforced epoxy resin, an epoxy resin with inorganic fillers, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through hole vias 1210-1 (that extend from a first face 1250 of the interposer 1204 to a second face 1254 of the interposer 1204), blind vias 1210-2 (that extend from the first or second faces 1250 or 1254 of the interposer 1204 to an internal metal layer), and buried vias 1210-3 (that connect internal metal layers).

In some embodiments, the interposer 1204 can comprise a silicon interposer. Through silicon vias (TSV) extending through the silicon interposer can connect connections on a first face of a silicon interposer to an opposing second face of the silicon interposer. In some embodiments, an interposer 1204 comprising a silicon interposer can further comprise one or more routing layers to route connections on a first face of the interposer 1204 to an opposing second face of the interposer 1204.

The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art. In embodiments where the interposer is a non-printed circuit board The integrated circuit device assembly 1200 may include an integrated circuit component 1224 coupled to the first face 1240 of the circuit board 1202 by coupling components 1222. The coupling components 1222 may take the form of any of the embodiments discussed above with reference to the coupling components 1216, and the integrated circuit component 1224 may take the form of any of the embodiments discussed above with reference to the integrated circuit component 1220.

The integrated circuit device assembly 1200 illustrated in FIG. 12 includes a package-on-package structure 1234 coupled to the second face 1242 of the circuit board 1202 by coupling components 1228. The package-on-package structure 1234 may include an integrated circuit component 1226 and an integrated circuit component 1232 coupled together by coupling components 1230 such that the integrated circuit component 1226 is disposed between the circuit board 1202 and the integrated circuit component 1232. The coupling components 1228 and 1230 may take the form of any of the embodiments of the coupling components 1216 discussed above, and the integrated circuit components 1226 and 1232 may take the form of any of the embodiments of the integrated circuit component 1220 discussed above. The package-on-package structure 1234 may be configured in accordance with any of the package-on-package structures known in the art.

Figure 13:
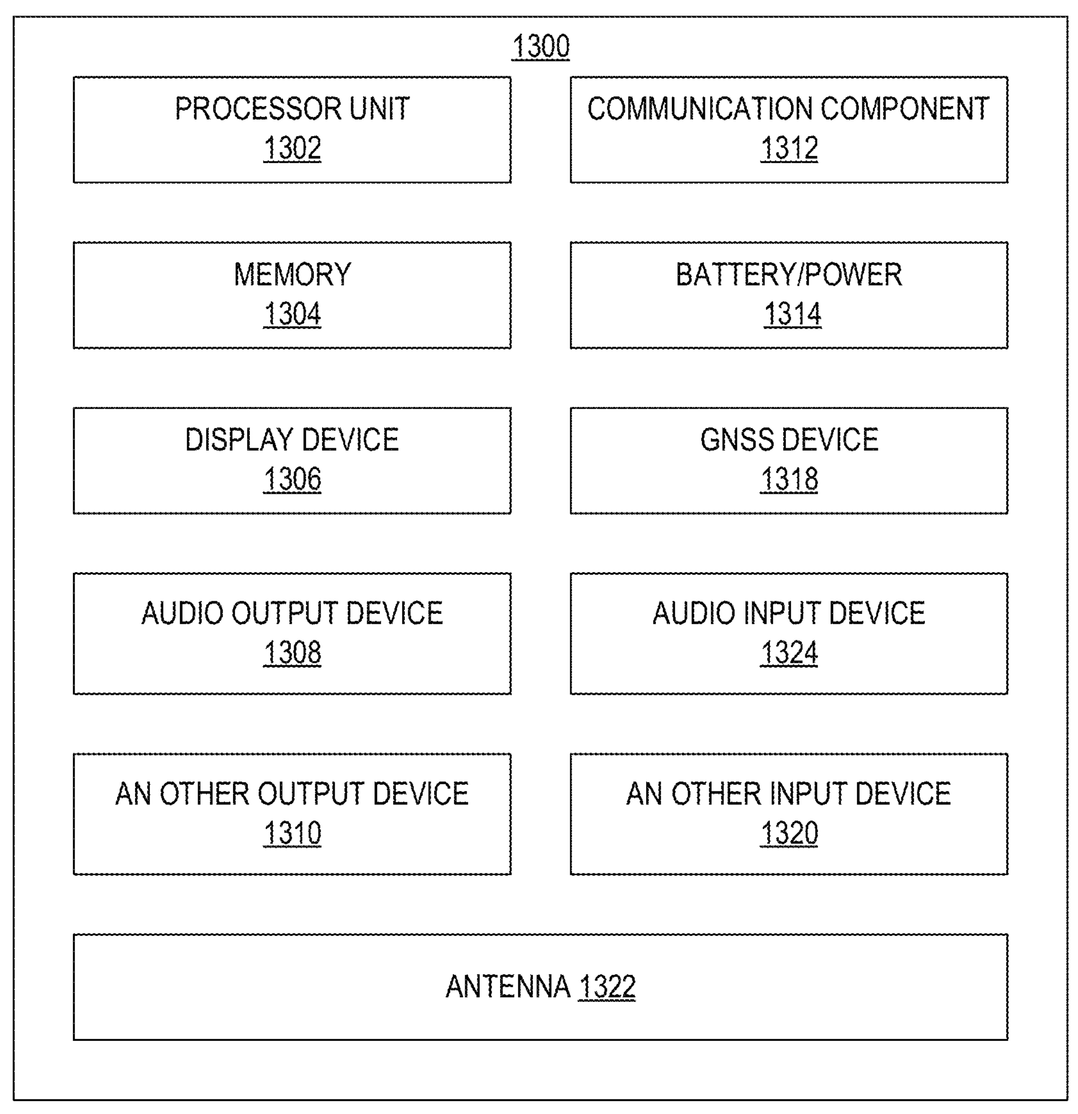
FIG. 13 is a block diagram of an example electrical device that may include a microelectronic assembly, in accordance with any of the embodiments disclosed herein.

FIG. 13 is a block diagram of an example electrical device 1300 that may include an integrated circuit component comprising any of the acoustic wave clock distribution technologies disclosed herein. For example, any suitable ones of the components of the electrical device 1300 may include one or more of the integrated circuit device assemblies 1200, integrated circuit components 1220, integrated circuit devices 1000, or integrated circuit dies 902 disclosed herein. A number of components are illustrated in FIG. 13 as included in the electrical device 1300, but any one or more of these components may be omitted or duplicated, as suitable for the application. In some embodiments, some or all of the components included in the electrical device 1300 may be attached to one or more motherboards, mainboards, or system boards. In some embodiments, one or more of these components are fabricated onto a single system-on-a-chip (SoC) die.

Additionally, in various embodiments, the electrical device 1300 may not include one or more of the components illustrated in FIG. 13, but the electrical device 1300 may include interface circuitry for coupling to the one or more components. For example, the electrical device 1300 may not include a display device 1306, but may include display device interface circuitry (e.g., a connector and driver circuitry) to which a display device 1306 may be coupled. In another set of examples, the electrical device 1300 may not include an audio input device 1324 or an audio output device 1308, but may include audio input or output device interface circuitry (e.g., connectors and supporting circuitry) to which an audio input device 1324 or audio output device 1308 may be coupled.

The electrical device 1300 may include one or more processor units 1302 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1302 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU). The processor units can execute computer-executable instructions in a manner similar to that discussed below in connection with FIG. 14, or other manners.

The electrical device 1300 may include a memory 1304, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-volatile memories), solid-state memory, and/or a hard drive. In some embodiments, the memory 1304 may include memory that is located on the same integrated circuit die as the processor unit 1302. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1300 can comprise one or more processor units 1302 that are heterogeneous or asymmetric to another processor unit 1302 in the electrical device 1300. There can be a variety of differences between the processing units 1302 in a system in terms of a spectrum of metrics of merit including architectural, microarchitectural, thermal, power consumption characteristics, and the like. These differences can effectively manifest themselves as asymmetry and heterogeneity among the processor units 1302 in the electrical device 1300.

In some embodiments, the electrical device 1300 may include a communication component 1312 (e.g., one or more communication components). For example, the communication component 1312 can manage wireless communications for the transfer of data to and from the electrical device 1300. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1312 may operate in accordance with other wireless protocols in other embodiments. The electrical device 1300 may include an antenna 1322 to facilitate wireless communications and/or to receive other wireless communications (such as AM or FM radio transmissions).

In some embodiments, the communication component 1312 may manage wired communications, such as electrical, optical, or any other suitable communication protocols (e.g., IEEE 802.3 Ethernet standards). As noted above, the communication component 1312 may include multiple communication components. For instance, a first communication component 1312 may be dedicated to shorter-range wireless communications such as Wi-Fi or Bluetooth, and a second communication component 1312 may be dedicated to longer-range wireless communications such as global positioning system (GPS), EDGE, GPRS, CDMA, WiMAX, LTE, EV-DO, or others. In some embodiments, a first communication component 1312 may be dedicated to wireless communications, and a second communication component 1312 may be dedicated to wired communications.

The electrical device 1300 may include battery/power circuitry 1314. The battery/power circuitry 1314 may include one or more energy storage devices (e.g., batteries or capacitors) and/or circuitry for coupling components of the electrical device 1300 to an energy source separate from the electrical device 1300 (e.g., AC line power).

The electrical device 1300 may include a display device 1306 (or corresponding interface circuitry, as discussed above). The display device 1306 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1300 may include an audio output device 1308 (or corresponding interface circuitry, as discussed above). The audio output device 1308 may include any embedded or wired or wirelessly connected external device that generates an audible indicator, such speakers, headsets, or earbuds.

The electrical device 1300 may include an audio input device 1324 (or corresponding interface circuitry, as discussed above). The audio input device 1324 may include any embedded or wired or wirelessly connected device that generates a signal representative of a sound, such as microphones, microphone arrays, or digital instruments (e.g., instruments having a musical instrument digital interface (MIDI) output). The electrical device 1300 may include a Global Navigation Satellite System (GNSS) device 1318 (or corresponding interface circuitry, as discussed above), such as a Global Positioning System (GPS) device. The GNSS device 1318 may be in communication with a satellite-based system and may determine a geolocation of the electrical device 1300 based on information received from one or more GNSS satellites, as known in the art.

The electrical device 1300 may include an other output device 1310 (or corresponding interface circuitry, as discussed above). Examples of the other output device 1310 may include an audio codec, a video codec, a printer, a wired or wireless transmitter for providing information to other devices, or an additional storage device.

The electrical device 1300 may include an other input device 1320 (or corresponding interface circuitry, as discussed above). Examples of the other input device 1320 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1300 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1300 may be any other electronic device that processes data. In some embodiments, the electrical device 1300 may comprise multiple discrete physical components. Given the range of devices that the electrical device 1300 can be manifested as in various embodiments, in some embodiments, the electrical device 1300 can be referred to as a computing device or a computing system.

Figure 14:
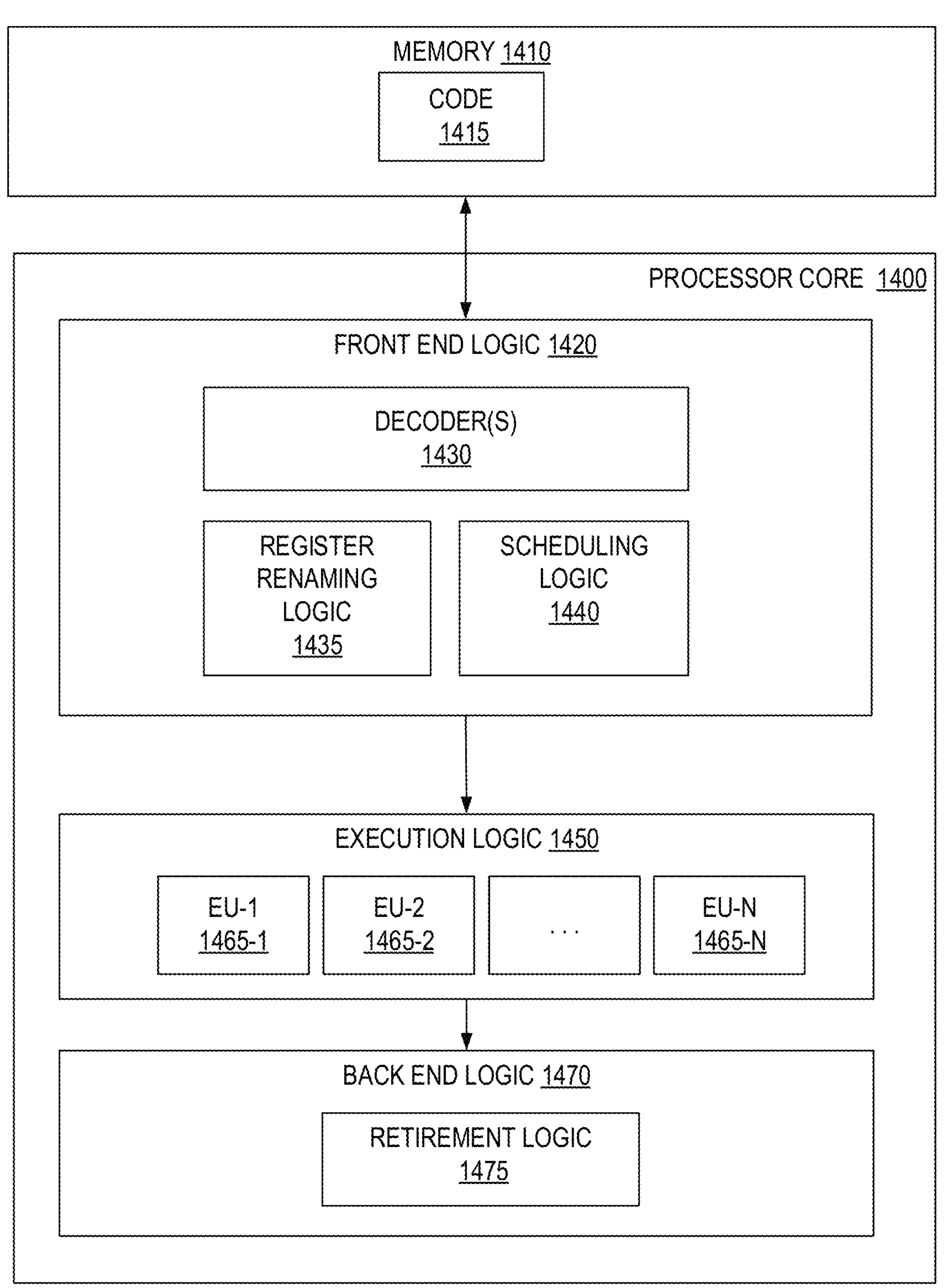
FIG. 14 is a block diagram of an example processor unit that can execute instructions as part of implementing technologies described herein.

FIG. 14 is a block diagram of an example processor unit 1400 to execute computer-executable instructions as part of implementing technologies described herein. The processor unit 1400 can be a single-threaded core or a multithreaded core in that it may include more than one hardware thread context (or "logical processor") per processor unit.

FIG. 14 also illustrates a memory 1410 coupled to the processor unit 1400. The memory 1410 can be any memory described herein or any other memory known to those of skill in the art. The memory 1410 can store computer-executable instructions 1415 (code) executable by the processor unit 1400.

The processor unit comprises front-end logic 1420 that receives instructions from the memory 1410. An instruction can be processed by one or more decoders 1430. The decoder 1430 can generate as its output a micro-operation such as a fixed width micro operation in a predefined format, or generate other instructions, microinstructions, or control signals, which reflect the original code instruction. The front-end logic 1420 further comprises register renaming logic 1435 and scheduling logic 1440, which generally allocate resources and queues operations corresponding to converting an instruction for execution.

The processor unit 1400 further comprises execution logic 1450, which comprises one or more execution units (EUs) 1465-1 through 1465-N. Some processor unit embodiments can include a number of execution units dedicated to specific functions or sets of functions. Other embodiments can include only one execution unit or one execution unit that can perform a particular function. The execution logic 1450 performs the operations specified by code instructions. After completion of execution of the operations specified by the code instructions, back-end logic 1470 retires instructions using retirement logic 1475. In some embodiments, the processor unit 1400 allows out of order execution but requires in-order retirement of instructions. Retirement logic 1475 can take a variety of forms as known to those of skill in the art (e.g., re-order buffers or the like).

The processor unit 1400 is transformed during execution of instructions, at least in terms of the output generated by the decoder 1430, hardware registers and tables utilized by the register renaming logic 1435, and any registers (not shown) modified by the execution logic 1450.

As used herein, the term "module" refers to logic that may be implemented in a hardware component or device, software or firmware running on a processor unit, or a combination thereof, to perform one or more operations consistent with the present disclosure. Software and firmware may be embodied as instructions and/or data stored on non-transitory computer-readable storage media. As used herein, the term "circuitry" can comprise, singly or in any combination, non-programmable (hardwired) circuitry, programmable circuitry such as processor units, state machine circuitry, and/or firmware that stores instructions executable by programmable circuitry. Modules described herein may, collectively or individually, be embodied as circuitry that forms a part of a computing system. Thus, any of the modules can be implemented as circuitry, such as acoustic transmitter controller circuitry. A computing system referred to as being programmed to perform a method can be programmed to perform the method via software, hardware, firmware, or combinations thereof.

Any of the disclosed methods (or a portion thereof) can be implemented as computer-executable instructions or a computer program product. Such instructions can cause a computing system or one or more processor units capable of executing computer-executable instructions to perform any of the disclosed methods. As used herein, the term "computer" refers to any computing system, device, or machine described or mentioned herein as well as any other computing system, device, or machine capable of executing instructions. Thus, the term "computer-executable instruction" refers to instructions that can be executed by any computing system, device, or machine described or mentioned herein as well as any other computing system, device, or machine capable of executing instructions.

The computer-executable instructions or computer program products as well as any data created and/or used during implementation of the disclosed technologies can be stored on one or more tangible or non-transitory computer-readable storage media, such as volatile memory (e.g., DRAM, SRAM), non-volatile memory (e.g., flash memory, chalcogenide-based phase-change non-volatile memory) optical media discs (e.g., DVDs, CDs), and magnetic storage (e.g., magnetic tape storage, hard disk drives). Computer-readable storage media can be contained in computer-readable storage devices such as solid-state drives, USB flash drives, and memory modules. Alternatively, any of the methods disclosed herein (or a portion) thereof may be performed by hardware components comprising non-programmable circuitry. In some embodiments, any of the methods herein can be performed by a combination of non-programmable hardware components and one or more processing units executing computer-executable instructions stored on computer-readable storage media.

The computer-executable instructions can be part of, for example, an operating system of the computing system, an application stored locally to the computing system, or a remote application accessible to the computing system (e.g., via a web browser). Any of the methods described herein can be performed by computer-executable instructions performed by a single computing system or by one or more networked computing systems operating in a network environment. Computer-executable instructions and updates to the computer-executable instructions can be downloaded to a computing system from a remote server.

Further, it is to be understood that implementation of the disclosed technologies is not limited to any specific computer language or program. For instance, the disclosed technologies can be implemented by software written in C++, C#, Java, Perl, Python, JavaScript, Adobe Flash, assembly language, or any other programming language. Likewise, the disclosed technologies are not limited to any particular computer system or type of hardware.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, cable (including fiber optic cable), magnetic communications, electromagnetic communications (including RF, microwave, ultrasonic, and infrared communications), electronic communications, or other such communication means.

As used in this application and the claims, a list of items joined by the term "and/or" can mean any combination of the listed items. For example, the phrase "A, B and/or C" can mean A; B; C; A and B; A and C; B and C; or A, B and C.

As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

As used in this application and the claims, the phrase "individual of" or "respective of" following by a list of items recited or stated as having a trait, feature, etc. means that all of the items in the list possess the stated or recited trait, feature, etc. For example, the phrase "individual of A, B, or C, comprise a sidewall" or "respective of A, B, or C, comprise a sidewall" means that A comprises a sidewall, B comprises a sidewall, and C comprises a sidewall.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 is an apparatus comprising: a substrate comprising a semiconductor; a first piezoelectric layer comprising a first piezoelectric material, the first piezoelectric layer located on a first surface of the substrate, a first region of the substrate comprising a first portion of a second surface of the substrate, the second surface of the substrate opposite the first surface of the substrate, a second region of the substrate comprising a second portion of the second surface of the substrate, a third region of the substrate comprising a third portion of the second surface of the substrate, both the first region and the second region being n-type or p-type, the third region being n-type if the first region and the second region are p-type, the third region being p-type if the first region and the second region are n-type; and a second piezoelectric layer comprising a second piezoelectric material, the second piezoelectric layer located on the third region of the second surface of the substrate and extending from the first portion of the substrate to the second portion of the substrate.

Example 2 comprises the apparatus of example 1, further comprising a layer comprising oxygen positioned between the second piezoelectric layer and the second surface of the substrate.

Example 3 comprises the apparatus of example 1, wherein the second piezoelectric layer is positioned adjacent to the second surface of the substrate.

Example 4 is an apparatus, comprising: a substrate comprising a semiconductor; a first piezoelectric layer comprising a first piezoelectric material, the first piezoelectric layer located on a first surface of the substrate, a first region of the substrate comprising a first portion of a second surface of the substrate, the second surface of the substrate opposite the first surface of the substrate, a second region of the substrate comprising a second portion of the second surface of the substrate, a third region of the substrate comprising a third portion of the second surface of the substrate, both the first region and the second region being n-type or p-type, the third region being n-type if the first region and the second region are p-type, the third region being p-type if the first region and the second region are n-type; an electrode comprising metal; a layer comprising oxygen positioned between the electrode and the second surface of the substrate, the electrode and the layer comprising oxygen extending from the first portion of the substrate to the second portion of the substrate; a second piezoelectric layer comprising a second piezoelectric material, the second piezoelectric layer positioned within a metallization stack located on the second surface of the substrate; and one or more conductive traces conductively coupling the second piezoelectric layer to at least one of the electrode, the first region of the substrate, or the second region of the substrate.

Example 5 comprises the apparatus of any one of examples 1-4, wherein the first surface of the substrate is substantially planar to the second surface of the substrate.

Example 6 comprises the apparatus of any one of examples 1-4, wherein the first region of the substrate, the second region of the substrate, and the third region of the substrate are located on a fin that extends upwards from the second surface of the substrate.

Example 7 is an apparatus, comprising: a substrate comprising a semiconductor; a first piezoelectric layer comprising a first piezoelectric material, the first piezoelectric layer located on a surface of the substrate, a first region of the substrate comprising a first portion of the surface of the substrate, a second region of the substrate comprising a second portion of the surface of the substrate, a third region of the substrate comprising a third portion of the surface of the substrate, both the first region and the second region being n-type or p-type, the third region being n-type if the first region and the second region are p-type, the third region being p-type if the first region and the second region are n-type; and a second piezoelectric layer comprising a second piezoelectric material, the second piezoelectric layer positioned adjacent to the third region of the surface of the substrate and extending from the first portion of the substrate to the second portion of the substrate.

Example 8 comprises the apparatus of example 7, further comprising a layer comprising oxygen positioned between the second piezoelectric layer and the surface of the substrate.

Example 9 comprises the apparatus of example 7, wherein the second piezoelectric layer is positioned adjacent to the surface of the substrate.

Example 10 is an apparatus, comprising: a substrate comprising a semiconductor; a first piezoelectric layer comprising a first piezoelectric material, the first piezoelectric layer located on a surface of the substrate, a first region of the substrate comprising a first portion of a surface of the substrate, a second region of the substrate comprising a second portion of the surface of the substrate, a third region of the substrate comprising a third portion of the surface of the substrate, both the first region and the second region being n-type or p-type, the third region being n-type if the first region and the second region are p-type, the third region being p-type if the first region and the second region are n-type; an electrode comprising metal; a layer comprising oxygen positioned between the electrode and the surface of the substrate, the electrode and the layer comprising oxygen extending from the first portion of the substrate to the second portion of the substrate; a second piezoelectric layer comprising a second piezoelectric material, the second piezoelectric layer positioned within a metallization stack located on the surface of the substrate; and one or more conductive traces conductively coupling the second piezoelectric layer to at least one of the electrode, the first region of the substrate, or the second region of the substrate.

Example 11 comprises the apparatus of any one of examples 7-10, wherein the surface of the substrate is substantially planar.

Example 12 comprises the apparatus of any one of examples 7-10, wherein the first region of the substrate, the second region of the substrate, and the third region of the substrate are located on a fin that extends upwards from the surface of the substrate.

Example 13 comprises the apparatus of any one of examples 1-12, wherein the semiconductor comprises silicon.

Example 14 comprises the apparatus of any one of examples 1-13, wherein the first piezoelectric layer and/or the second piezoelectric layer comprises aluminum and nitrogen.

Example 15 comprises the apparatus of any one of examples 1-13, wherein the first piezoelectric layer and/or the second piezoelectric layer comprises scandium, aluminum, and nitrogen.

Example 16 comprises the apparatus of any one of examples 1-13, wherein the first piezoelectric layer and/or the second piezoelectric layer comprises barium, titanium, and oxygen.

Example 17 comprises the apparatus of any one of examples 1-13, wherein the first piezoelectric layer and/or the second piezoelectric layer comprises carbon, hydrogen, and fluorine.

Example 18 comprises the apparatus of any one of examples 1-13, wherein the first piezoelectric layer and/or the second piezoelectric layer comprises polyvinylidene fluoride.

Example 19 comprises the apparatus of any one of examples 1-13, wherein the first piezoelectric layer and/or the second piezoelectric layer comprises hafnium and oxygen.

Example 20 comprises the apparatus of any one of examples 1-13, wherein the first piezoelectric layer and/or the second piezoelectric layer comprises beryllium and oxygen.

Example 21 comprises the apparatus of any one of examples 1-13, wherein the first piezoelectric layer and/or the second piezoelectric layer comprises lead, titanium, and oxygen.

Example 22 comprises the apparatus of any one of examples 1-13, wherein the first piezoelectric layer and/or the second piezoelectric layer comprises lithium, niobium, and oxygen.

Example 23 comprises the apparatus of any one of examples 1-13, wherein the first piezoelectric layer and/or the second piezoelectric layer comprises lead, zirconium, titanium, and oxygen.

Example 24 comprises the apparatus of any one of examples 1-13, wherein the first piezoelectric layer and/or the second piezoelectric layer comprises lead, magnesium, niobium, oxygen, and titanium.

Example 25 comprises the apparatus of any one of examples 1-24, wherein the first piezoelectric layer is located between a first metal layer and a second metal layer.

Example 26 comprises the apparatus of any one of examples 1-24, wherein a first metal layer and a second metal layer are located on a surface of the first piezoelectric layer.

Example 27 comprises the apparatus of example 25 or 26, wherein the first metal layer and the second metal layer comprise molybdenum.

Example 28 comprises the apparatus of any one of examples 25-27, further comprising a layer comprising a metal-epoxy composite located on the first piezoelectric layer.

Example 29 comprises the apparatus of any one of examples 1-6, further comprising a multi-layer structure located on the first piezoelectric layer, the multi-layer structure comprising one or more layers comprising metal alternating with one or more layers comprising an epoxy.

Example 30 comprises the apparatus of any one of examples 1-6 further comprising one or more third piezoelectric layers located on the first surface of the substrate, the one or more third piezoelectric layers conductively coupled to the first piezoelectric layer.

Example 31 comprises the apparatus of example 2 or 10, wherein the electrode comprises two or more layers comprising metal.

Example 32 comprises the apparatus of any one of examples 1-31, wherein the first region of the substrate and the second region of the substrate are n-type.

Example 33 comprises the apparatus of any one of examples 1-31, wherein the first region of the substrate and the second region of the substrate are p-type.

Example 34 comprises the apparatus of any one of examples 1-33, wherein the apparatus is an integrated circuit component.

Example 35 comprises the apparatus of example 34, wherein the integrated circuit component is attached to a printed circuit board.

Example 36 comprises the apparatus of example 35, wherein the integrated circuit component is a first integrated circuit component and one or more additional integrated circuit components are attached to the printed circuit board.

Example 37 comprises the apparatus of example 35, further comprising a housing that encloses the printed circuit board and the integrated circuit component.

Example 38 is a method comprising: generating a first bulk acoustic wave in a substrate comprising a semiconductor, the generating the first bulk acoustic wave comprising activating a first acoustic transmitter located on a first surface of the substrate and activating a second acoustic transmitter located on the first surface of the substrate a first delay after activating the first acoustic transmitter; determining a second delay based on information indicating a temperature gradient in an integrated circuit component comprising the substrate, the second delay different than the first delay; generating a second bulk acoustic wave in the substrate, the generating the second bulk acoustic wave comprising activating the first acoustic transmitter and activating the second acoustic transmitter the second delay after activating the first acoustic transmitter; and receiving the first bulk acoustic wave and the second bulk acoustic wave at a piezoelectric layer positioned adjacent to a second surface of the substrate, the second surface opposite the first surface, a first region of the substrate comprising a first portion of the second surface of the substrate, a second region of the substrate comprising a second portion of the second surface of the substrate, a third region of the substrate comprising a third portion of the second surface of the substrate, both the first region and the second region being n-type or p-type, the third region being n-type if the first region and the second region are p-type, the third region being p-type if the first region and the second region are n-type, the piezoelectric layer positioned adjacent to the third region of the second surface of the substrate and extending from the first portion of the substrate to the second portion of the substrate.

Example 39 comprises the method of example 38, wherein the information indicating a temperature gradient is based on information generated by two or more temperature sensors located in the integrated circuit component.

Example 40 comprises the method of example 39, wherein the information indicating a temperature gradient is further based on location information associated with the two or more temperature sensors.

Example 41 comprises the method of example 39, wherein the information indicating a temperature gradient is further based on location information associated with the first acoustic transmitter and/or the second acoustic transmitter.

Example 42 comprises the method of any one of examples 38-41, wherein the semiconductor comprises silicon.

Example 43 comprises the method of any one of examples 38-42, wherein the first acoustic transmitter comprises a piezoelectric layer comprising aluminum and nitrogen.

Example 44 comprises the method of any one of examples 38-42, wherein the first acoustic transmitter comprises a piezoelectric layer comprising scandium, aluminum, and nitrogen.

Example 45 comprises the method of any one of examples 38-42, wherein the first acoustic transmitter comprises a piezoelectric layer comprising barium, titanium, and oxygen.

Example 46 comprises the method of any one of examples 38-42, wherein the first acoustic transmitter comprises a piezoelectric layer comprising carbon, hydrogen, and fluorine.

Example 47 comprises the method of any one of examples 38-42, wherein the first acoustic transmitter comprises a piezoelectric layer comprising polyvinylidene fluoride.

Example 48 comprises the method of any one of examples 38-42, wherein the first acoustic transmitter comprises a piezoelectric layer comprising hafnium and oxygen.

Example 49 comprises the method of any one of examples 38-42, wherein the first acoustic transmitter comprises a piezoelectric layer comprising beryllium and oxygen.

Example 50 comprises the method of any one of examples 38-42, wherein the first piezoelectric layer and/or the second piezoelectric layer comprises lead, titanium, and oxygen.

Example 51 comprises the method of any one of examples 38-42, wherein the first piezoelectric layer and/or the second piezoelectric layer comprises lithium, niobium, and oxygen.

Example 52 comprises the method of any one of examples 38-42, wherein the first piezoelectric layer and/or the second piezoelectric layer comprises lead, zirconium, titanium, and oxygen.

Example 53 comprises the method of any one of examples 38-42, wherein the first piezoelectric layer and/or the second piezoelectric layer comprises lead, magnesium, niobium, oxygen, and titanium.

Example 54 comprises the method of any one of examples 38-53, wherein the first acoustic transmitter comprises a first metal layer, a second metal layer, and a piezoelectric layer positioned between the first metal layer and the second metal layer.

Example 55 comprises the method of example 54, wherein the first acoustic transmitter further comprises a layer comprising metal-epoxy composite positioned adjacent to the second metal layer, the first metal layer positioned between the piezoelectric layer and the substrate.

Example 56 comprises the method of example 54, wherein the apparatus is an integrated circuit component and the first metal layer or the second metal layer is conductively coupled to a coupling component of the integrated circuit component.

Example 57 is an apparatus, comprising: a substrate comprising a semiconductor; an acoustic wave generation means to generate an acoustic wave; an acoustic wave receiver means to generate an electrical signal in response to the acoustic wave receiver receiving the acoustic wave; a local clock generation means to generate a local clock signal based on the electrical signal; and a local clock distribution means to distribute the local clock signal to one or more transistors in a vicinity of the acoustic wave receiver means.

Example 58 comprises the apparatus of example 57, wherein the acoustic wave generation means is located on a first surface of the substrate, the acoustic wave receiver means is located on a second surface of the substrate opposite the first surface of the substrate.

Example 59 comprises the apparatus of example 57, wherein the acoustic wave generation means and the acoustic wave receiver means are located on a surface of the substrate.

Example 60 comprises the apparatus of any one of examples 57-59, wherein the apparatus does not comprise a clock tree.

Example 61 comprises the apparatus of any one of examples 57-60, wherein the semiconductor comprises silicon.

Example 62 comprises the apparatus of any one of examples 57-61, wherein the apparatus is an integrated circuit component and the acoustic wave generation means generates the acoustic wave from a clock source signal provided to the integrated circuit component.

Example 63 comprises the apparatus of any one of examples 57-61, wherein the apparatus is an integrated circuit component.

Example 64 comprises the apparatus of example 63, wherein the integrated circuit component is attached to a printed circuit board.

Example 65 comprises the apparatus of example 64, wherein the integrated circuit component is a first integrated circuit component and one or more additional integrated circuit components are attached to the printed circuit board.

The invention claimed is:

1. An apparatus, comprising:

a substrate comprising a semiconductor;

a first piezoelectric layer comprising a first piezoelectric material, the first piezoelectric layer located on a first surface of the substrate, a first region of the substrate comprising a first portion of a second surface of the substrate, the second surface of the substrate opposite the first surface of the substrate, a second region of the substrate comprising a second portion of the second surface of the substrate, a third region of the substrate comprising a third portion of the second surface of the substrate, both the first region and the second region being n-type or p-type, the third region being n-type if the first region and the second region are p-type, the third region being p-type if the first region and the second region are n-type; and a second piezoelectric layer comprising a second piezoelectric material, the second piezoelectric layer located on the third region of the second surface of the substrate and extending from the first portion of the substrate to the second portion of the substrate.

2. The apparatus of claim 1, further comprising a layer comprising oxygen positioned between the second piezoelectric layer and the second surface of the substrate.

3. The apparatus of claim 1, wherein the first region of the substrate, the second region of the substrate, and the third region of the substrate are located on a fin that extends upwards from the second surface of the substrate.

4. The apparatus of claim 1, wherein the first piezoelectric layer and/or the second piezoelectric layer comprises:

aluminum and nitrogen;

scandium, aluminum, and nitrogen; or barium, titanium, and oxygen.

5. The apparatus of claim 1, wherein the first piezoelectric layer and/or the second piezoelectric layer comprises:

carbon, hydrogen, and fluorine; or polyvinylidene fluoride.

6. The apparatus of claim 1, wherein the first piezoelectric layer and/or the second piezoelectric layer comprises:

lead, titanium, and oxygen; or lithium, niobium, and oxygen.

7. The apparatus of claim 1, wherein the first piezoelectric layer and/or the second piezoelectric layer comprises:

lead, zirconium, titanium, and oxygen; or lead, magnesium, niobium, oxygen, and titanium.

8. The apparatus of claim 1, wherein the first piezoelectric layer is located between a first metal layer and a second metal layer.

9. The apparatus of claim 1, wherein the apparatus is an integrated circuit component.

10. The apparatus of claim 9, wherein the integrated circuit component is attached to a printed circuit board and one or more additional integrated circuit components are attached to the printed circuit board.

11. An apparatus, comprising:

a substrate comprising a semiconductor;

a first piezoelectric layer comprising a first piezoelectric material, the first piezoelectric layer located on a surface of the substrate, a first region of the substrate comprising a first portion of the surface of the substrate, a second region of the substrate comprising a second portion of the surface of the substrate, a third region of the substrate comprising a third portion of the surface of the substrate, both the first region and the second region being n-type or p-type, the third region being n-type if the first region and the second region are p-type, the third region being p-type if the first region and the second region are n-type; and a second piezoelectric layer comprising a second piezoelectric material, the second piezoelectric layer positioned adjacent to the third region of the surface of the substrate and extending from the first portion of the substrate to the second portion of the substrate.

12. The apparatus of claim 11, further comprising a layer comprising oxygen positioned between the second piezoelectric layer and the surface of the substrate.

13. The apparatus of claim 11, wherein the first region of the substrate, the second region of the substrate, and the third region of the substrate are located on a fin that extends upwards from the surface of the substrate.

14. The apparatus of claim 11, wherein the first piezoelectric layer and/or the second piezoelectric layer comprises:

aluminum and nitrogen;

scandium, aluminum, and nitrogen; or barium, titanium, and oxygen.

15. The apparatus of claim 11, wherein the first piezoelectric layer and/or the second piezoelectric layer comprises:

hafnium and oxygen; or beryllium and oxygen.

16. The apparatus of claim 11, wherein the first piezoelectric layer and/or the second piezoelectric layer comprises:

lead, titanium, and oxygen; or lithium, niobium, and oxygen.

17. The apparatus of claim 11, wherein the first piezoelectric layer and/or the second piezoelectric layer comprises:

lead, zirconium, titanium, and oxygen; or lead, magnesium, niobium, oxygen, and titanium.

18. The apparatus of claim 11, wherein the first piezoelectric layer is located between a first metal layer and a second metal layer.

19. The apparatus of claim 11, wherein the apparatus is an integrated circuit component.

20. The apparatus of claim 19, wherein the integrated circuit component is attached to a printed circuit board and one or more additional integrated circuit components are attached to the printed circuit board.

* * * * *